US011348918B2

(12) United States Patent
Kim et al.

(10) Patent No.: US 11,348,918 B2
(45) Date of Patent: May 31, 2022

(54) SEMICONDUCTOR DEVICE

(71) Applicant: SAMSUNG ELECTRONICS CO., LTD., Suwon-si (KR)

(72) Inventors: Taehyung Kim, Hwaseong-si (KR); Jinwoo Jeong, Suwon-si (KR); Jiwook Kwon, Daejeon (KR); Raheel Azmat, Suwon-si (KR); Kwanyoung Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 90 days.

(21) Appl. No.: 16/864,260

(22) Filed: May 1, 2020

(65) Prior Publication Data

US 2021/0057411 A1 Feb. 25, 2021

(30) Foreign Application Priority Data

Aug. 21, 2019 (KR) ........................ 10-2019-0102583

(51) Int. Cl.
*H01L 27/092* (2006.01)
*H01L 23/528* (2006.01)
(Continued)

(52) U.S. Cl.
CPC .... *H01L 27/0922* (2013.01); *H01L 21/02532* (2013.01); *H01L 21/02603* (2013.01); *H01L 21/823807* (2013.01); *H01L 21/823814* (2013.01); *H01L 21/823871* (2013.01); *H01L 23/5286* (2013.01); *H01L 27/0207* (2013.01); *H01L 27/1108* (2013.01); *H01L 29/0673* (2013.01); *H01L 29/42392* (2013.01); *H01L 29/66742* (2013.01); *H01L 29/7848* (2013.01); *H01L 29/78618* (2013.01); *H01L 29/78696* (2013.01)

(58) Field of Classification Search
CPC .......... H01L 27/0207; H01L 29/78696; H01L 27/0922; H01L 23/5286; H01L 21/823431; H01L 21/823831
See application file for complete search history.

(56) References Cited

U.S. PATENT DOCUMENTS 6,838,713 B1 * 1/2005 Gheewala ......... H01L 27/11807
257/211
7,329,938 B2 2/2008 Kinoshita et al.
(Continued)

FOREIGN PATENT DOCUMENTS

WO  WO-2015200363 A1 * 12/2015 ......... H01L 27/0207

*Primary Examiner* — Victoria K. Hall
(74) *Attorney, Agent, or Firm* — Lee IP Law, P.C.

(57) ABSTRACT

A semiconductor device including a substrate; first to third active patterns on an upper portion of the substrate, the active patterns being sequentially arranged in a first direction and extending in a second direction crossing the first direction; first to third power rails respectively connected to the first to third active patterns, wherein a width of the second active pattern in the first direction is at least two times a width of the first active pattern in the first direction and is at least two times a width of the third active pattern in the first direction, the first active pattern is not vertically overlapped with the first power rail, the second active pattern is vertically overlapped with the second power rail, and the third active pattern is not vertically overlapped with the third power rail.

15 Claims, 29 Drawing Sheets

(51) Int. Cl.

| | | |
|---|---|---|
| *H01L 27/11* | (2006.01) |
| *H01L 29/06* | (2006.01) |
| *H01L 29/423* | (2006.01) |
| *H01L 29/78* | (2006.01) |
| *H01L 29/786* | (2006.01) |
| *H01L 21/02* | (2006.01) |
| *H01L 21/8238* | (2006.01) |
| *H01L 29/66* | (2006.01) |
| *H01L 27/02* | (2006.01) |

(56) References Cited

U.S. PATENT DOCUMENTS

| | | | |
|---|---|---|---|
| 7,564,077 B2 | 7/2009 | Ko et al. | |
| 7,707,521 B2 * | 4/2010 | Tsai | H01L 27/11807 |
| | | | 716/120 |
| 8,357,955 B2 * | 1/2013 | Tanaka | H01L 27/0207 |
| | | | 257/206 |
| 8,698,205 B2 | 4/2014 | Tzeng et al. | |
| 9,035,361 B2 | 5/2015 | Lu et al. | |
| 9,786,645 B2 | 10/2017 | Yang | |
| 9,929,087 B2 | 3/2018 | Guo et al. | |
| RE47,095 E | 10/2018 | Tanaka | |
| 10,185,798 B2 * | 1/2019 | Kim | H01L 29/0673 |
| 11,121,138 B1 * | 9/2021 | Chiu | H01L 21/823814 |
| 11,223,344 B2 * | 1/2022 | Azmat | H03K 3/0372 |
| 2015/0194427 A1 * | 7/2015 | Sengupta | H01L 27/0207 |
| | | | 257/401 |
| 2018/0315709 A1 | 11/2018 | Schultz | |
| 2018/0358346 A1 | 12/2018 | Kim et al. | |
| 2018/0366589 A1 | 12/2018 | Shimbo | |
| 2019/0214473 A1 * | 7/2019 | Xie | H01L 21/823431 |
| 2020/0091349 A1 * | 3/2020 | Kang | H01L 27/0922 |
| 2020/0105752 A1 * | 4/2020 | Liaw | H01L 29/42392 |
| 2020/0105761 A1 * | 4/2020 | Liaw | H01L 21/823821 |
| 2020/0365602 A1 * | 11/2020 | Yang | B82Y 10/00 |
| 2021/0020643 A1 * | 1/2021 | Yang | H01L 29/7851 |
| 2021/0098338 A1 * | 4/2021 | Liaw | H01L 27/092 |
| 2021/0098455 A1 * | 4/2021 | Yu | H01L 27/0207 |
| 2021/0184038 A1 * | 6/2021 | Lim | H01L 29/78696 |
| 2021/0193657 A1 * | 6/2021 | Kim | H01L 29/1037 |
| 2021/0202465 A1 * | 7/2021 | Wang | H01L 21/823412 |
| 2021/0357565 A1 * | 11/2021 | Fang | G06F 30/392 |

\* cited by examiner

SEMICONDUCTOR DEVICE

CROSS-REFERENCE TO RELATED APPLICATIONS

Korean Patent Application No. 10-2019-0102583, filed on Aug. 21, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Due to their small-sized, multifunctional, and/or low-cost characteristics, semiconductor devices are important elements in the electronic industry. The semiconductor devices may include a semiconductor memory device for storing data, a semiconductor logic device for processing data, and a hybrid semiconductor device including both of memory and logic elements.

SUMMARY

The embodiments may be realized by providing a semiconductor device including a substrate; at least one first active pattern, at least one second active pattern, and at least one third active pattern on an upper portion of the substrate, the at least one first active pattern, the at least one second active pattern, and the at least one third active pattern being sequentially arranged in a first direction and extending in a second direction crossing the first direction; a first power rail connected to the at least one first active pattern; a second power rail connected to the at least one second active pattern; and a third power rail connected to the at least one third active pattern, wherein a width of the at least one second active pattern in the first direction is at least two times a width of the at least one first active pattern in the first direction and is at least two times a width of the at least one third active pattern in the first direction, the at least one first active pattern is not vertically overlapped with the first power rail, the at least one second active pattern is vertically overlapped with the second power rail, and the at least one third active pattern is not vertically overlapped with the third power rail.

The embodiments may be realized by providing a semiconductor device including a substrate; a first active pattern, a second active pattern, a third active pattern, and a fourth active pattern on an upper portion of the substrate and sequentially arranged in a first direction; a first source/drain pattern, a second source/drain pattern, a third source/drain pattern, and a fourth source/drain pattern on the first active pattern, the second active pattern, the third active pattern, and the fourth active pattern, respectively; a gate electrode crossing the first active pattern, the second active pattern, the third active pattern, and the fourth active pattern and extending in the first direction; and a first power rail, a second power rail, a third power rail, and a fourth power rail connected to the first source/drain pattern, the second source/drain pattern, the third source/drain pattern, and the fourth source/drain pattern, respectively, the first power rail, the second power rail, the third power rail, and the fourth power rail extending in a second direction crossing the first direction, wherein a width of the second active pattern in the first direction is at least two times a width of the first active pattern in the first direction, a width of the third active pattern in the first direction is at least two times the width of the first active pattern in the first direction, the width of the second active pattern in the first direction is at least two times a width of the fourth active pattern in the first direction, the width of the third active pattern in the first direction is at least two times the width of the fourth active pattern in the first direction, the first active pattern is not vertically overlapped with the first power rail, the second active pattern is vertically overlapped with the second power rail, the third active pattern is vertically overlapped with the third power rail, and the fourth active pattern is not vertically overlapped with the fourth power rail.

The embodiments may be realized by providing a semiconductor device including a first power rail, a second power rail, and a third power rail on a substrate and are sequentially arranged in a first direction; a first logic cell including a first active pattern, which is between the first power rail and the second power rail; and a second logic cell including a second active pattern, which is between the second power rail and the third power rail and extends to a region below the third power rail, wherein a width of the second active pattern in the first direction is two to three times a width of the first active pattern in the first direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
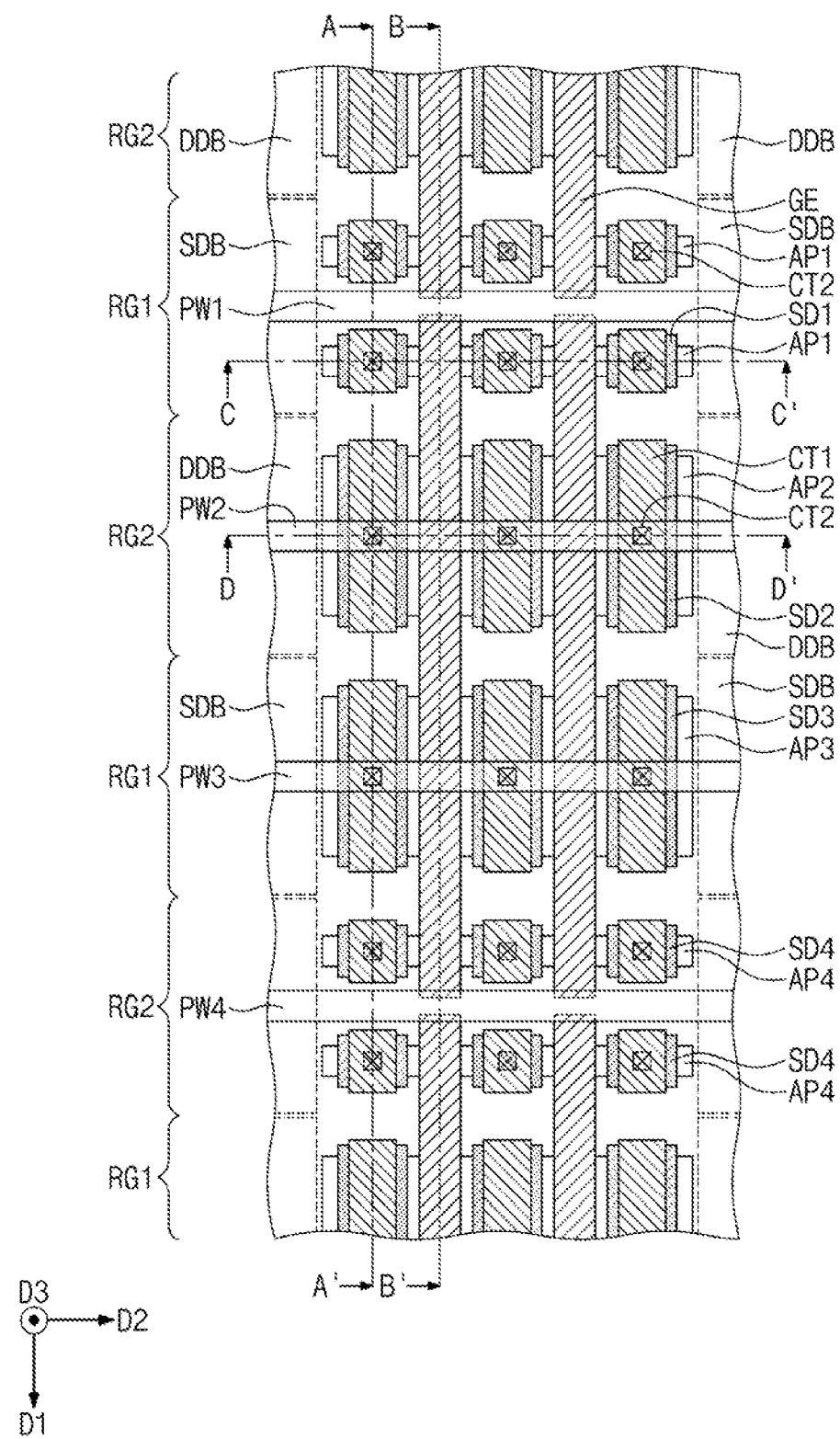
FIG. 1A illustrates a plan view of a semiconductor device according to an embodiment.
Figure 1B:
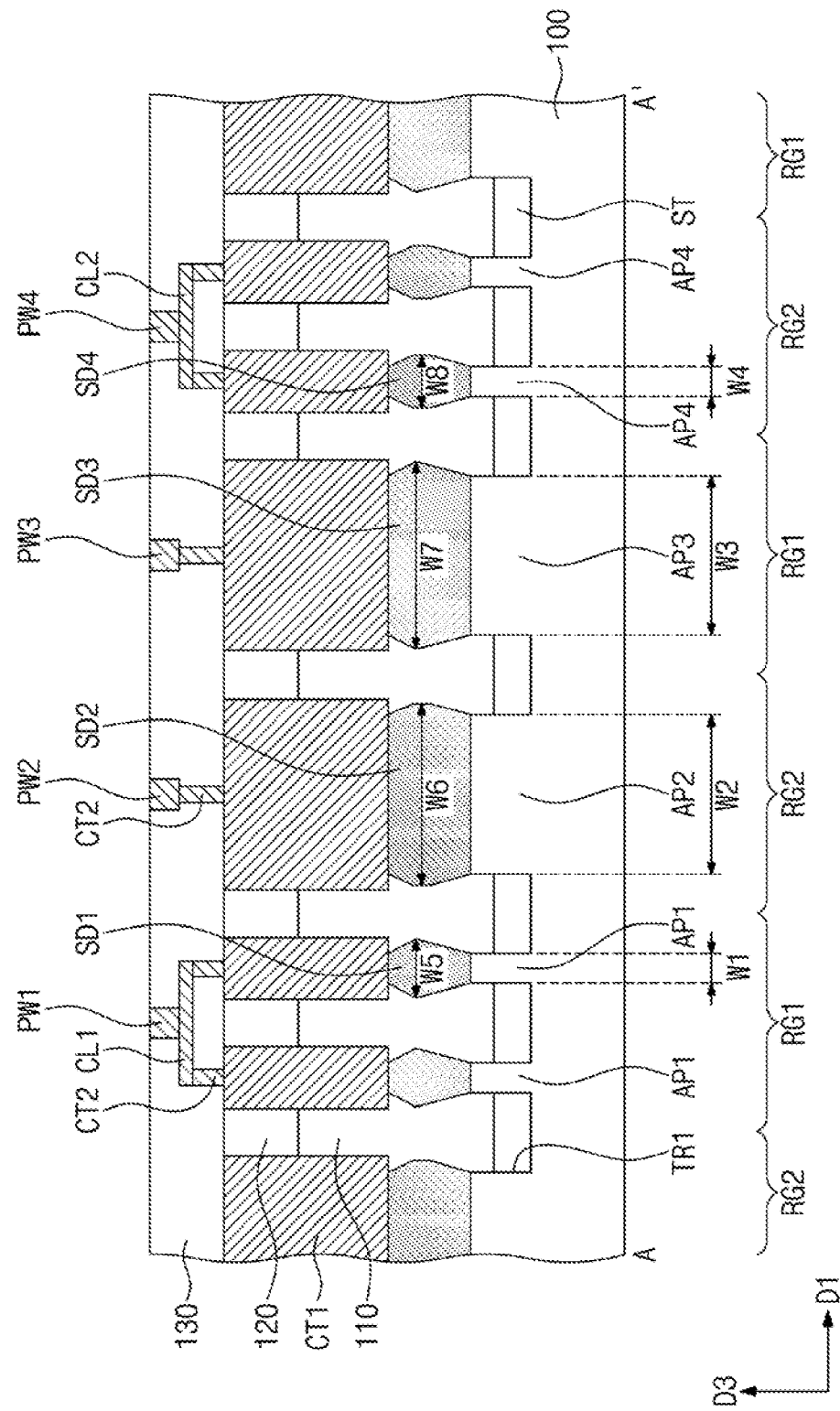
FIGS. 1B, 1C, 1D and 1E illustrate sectional views taken along lines A-A', B-B', C-C', and D-D', respectively, of FIG. 1A.

FIG. 1A illustrates a plan view of a semiconductor device according to an embodiment. FIGS. 1B, 1C, 1D and 1E illustrate sectional views taken along lines A-A', B-B', C-C', and D-D', respectively, of FIG. 1A.

Referring to FIGS. 1A, 1B, 1C, 1D, and 1E, a substrate 100 including first regions RG1 and second regions RG2 may be provided. The first and second regions RG1 and RG2 may be alternately arranged in or along a first direction D1. The first direction D1 may be a direction that is parallel to a top surface of the substrate 100. The substrate 100 may be a semiconductor substrate. For example, the substrate 100 may be a silicon wafer, a germanium wafer, or a silicon-on-insulator (SOI) wafer.

In an implementation, each of the first and second regions RG1 and RG2 of the substrate 100 may be a memory cell region, on which a plurality of memory cells to store data are formed. In this case, a plurality of memory cell transistors constituting SRAM cells may be on the memory cell region of the substrate 100.

In an implementation, the first and second regions RG1 and RG2 of the substrate 100 may be a logic cell region, on which logic transistors constituting a logic circuit of the semiconductor device are disposed. In this case, logic transistors constituting a processor core or I/O terminals may be on the logic cell region of the substrate 100.

First transistors may be on the first regions RG1, and second transistors may be on the second regions RG2. The first transistors and the second transistors may have different conductivity types from each other. For example, the first regions RG1 may be p-type metal-oxide-semiconductor field-effect transistor (PMOSFET) regions, the first transistors may be PMOSFETs, the second regions RG2 may be n-type metal-oxide-semiconductor field-effect transistor (NMOSFET) regions, and the second transistors may be NMOSFETs. For example, the first transistors on the first regions RG1 may include first source/drain patterns SD1, which are doped with n-type impurities, and the second transistors on the second regions RG2 may include second source/drain patterns SD2, which are doped with p-type impurities. In an implementation, the first transistors may be NMOSFETs, and the second transistors may be PMOSFETs.

First, second, third, and fourth active patterns AP1, AP2, AP3, and AP4 may be defined in an upper portion of the substrate 100. In an implementation, a pair of the first active patterns AP1, the second active pattern AP2, the third active pattern AP3, and a pair of the fourth active patterns AP4 may be sequentially arranged in the first direction D1. The pair of the first active patterns AP1 may be on the first region RG1. The second active pattern AP2 may be on the second region RG2. The third active pattern AP3 may be on the first region RG1. The pair of the fourth active patterns AP4 may be on the second region RG2.

Each of the first to fourth active patterns AP1, AP2, AP3, and AP4 may be a line- or bar-shaped pattern extending (e.g., lengthwise) in a second direction D2. The second direction D2 may be a direction parallel to the top surface of the substrate 100 and perpendicular to the first direction D1.

A width of the first active pattern AP1 in the first direction D1 may be defined as a first width W1. A width of the second active pattern AP2 in the first direction D1 may be defined as a second width W2. A width of the third active pattern AP3 in the first direction D1 may be defined as a third width W3. A width of the fourth active pattern AP4 in the first direction D1 may be defined as a fourth width W4.

The first width W1 and the fourth width W4 may be equal to or different from each other. The second width W2 and the third width W3 may be equal to or different from each other. The second width W2 may be at least two times the first width W1. The second width W2 may be at least two times the fourth width W4. The third width W3 may be at least two times the first width W1. The third width W3 may be at least two times the fourth width W4.

In an implementation, as illustrated in the drawings, two active patterns AP2 and AP3 may be between the pair of the first active patterns AP1 and the pair of the fourth active patterns AP4 (i.e., between the first and fourth active patterns AP1 and AP4 located adjacent to each other). In an implementation, three or more active patterns may be between the pair of the first active patterns AP1 and the pair of the fourth active patterns AP4. In an implementation, a structure, in which active patterns with relatively large widths (i.e., the second and third active patterns AP2 and AP3) are between a pair of active patterns with relatively small widths (i.e., the first active patterns AP1) and a pair of active patterns with relatively small widths (i.e., the fourth active patterns AP4), may be repeated in the semiconductor device.

A device isolation layer ST may be on the substrate 100. The device isolation layer ST may fill a lower portion of a first trench TR1. The first trench TR1 may be between each pair of the active patterns AP1, AP2, AP3, and AP4, which are adjacent to each other in the first direction D1. The first trenches TR1 may be arranged in the first direction D1. The first trenches TR1 may extend (lengthwise) in the second direction D2.

The first region RG1 may include a pair of single diffusion blocking regions SDB. In the first region RG1, the single diffusion blocking regions SDB may be spaced apart from each other in the second direction D2. The second region RG2 may include a pair of double diffusion blocking regions DDB. In the second region RG2, the double diffusion blocking regions DDB may be spaced apart from each other in the second direction D2.

The active patterns AP1, AP2, AP3, and AP4 may be between the pair of the single diffusion blocking regions SDB and between the pair of the double diffusion blocking regions DDB. For example, one pair of the first active patterns AP1 may be between one pair of the single diffusion blocking regions SDB, and the second active pattern AP2 may be between one pair of the double diffusion blocking regions DDB.

A second trench TR2 may be on the double diffusion blocking region DDB. The second trenches TR2 may extend in the first direction D1. A lower portion of the second trench TR2 may be filled with the device isolation layer ST.

A third trench TR3 may be on the double diffusion blocking region DDB and single diffusion blocking region SDB. The third trench TR3 may extend along the single diffusion blocking regions SDB and the double diffusion blocking regions DDB, which are arranged in the first direction D1. For example, the third trench TR3 may extend (lengthwise) in the first direction D1. The third trench TR3 may be filled with a diffusion blocking pattern DBP. In an implementation, the diffusion blocking pattern DBP may be formed of or include silicon oxide or silicon oxynitride. As used herein, the term "or" is not an exclusive term, e.g., "A or B" would include A, B, or A and B.

In the double diffusion blocking region DDB, an upper portion of the second trench TR2 (e.g., portion distal to the substrate 100 in a third direction D3) may be defined as the third trench TR3. For example, in the double diffusion blocking region DDB, the lower portion of the second trench TR2 may be filled with the device isolation layer ST, and the upper portion of the second trench TR2 on the device isolation layer ST may be filled with the diffusion blocking pattern DBP. A level of a bottom surface of the second trench TR2 may be lower (in the third direction D3) than a level of a bottom surface of the third trench TR3.

The shapes of the active patterns AP1, AP2, AP3, and AP4 may be defined by the first to third trenches TR1, TR2, and TR3. A top surface of the device isolation layer ST may be lower than top surfaces of the active patterns AP1, AP2, AP3, and AP4. The first source/drain patterns SD1 may be on each of the first active patterns AP1, the second source/ drain patterns SD2 may be on the second active pattern AP2, third source/drain patterns SD3 may be on the third active pattern AP3, and fourth source/drain patterns SD4 may be on each of the fourth active patterns AP4.

A channel pattern CH may be in each of regions between an adjacent pair of the first source/drain patterns SD1, between an adjacent pair of the second source/drain patterns SD2, between an adjacent pair of the third source/drain patterns SD3, and between an adjacent pair of the fourth source/drain patterns SD4.

Each of the channel patterns CH may include first to third semiconductor patterns SP1, SP2, and SP3, which are sequentially stacked. The first to third semiconductor patterns SP1, SP2, and SP3 may be spaced apart from each other in the third direction D3, which is perpendicular to the top surface of the substrate 100 (e.g., perpendicular to the first direction D1 and the second direction D2). The first to third semiconductor patterns SP1, SP2, and SP3 may be overlapped with each other vertically (e.g., when viewed in a plan view). Each of the first to fourth source/drain patterns SD1, SD2, SD3, and SD4 may be in direct contact with a side surface of each of the first to third semiconductor patterns SP1, SP2, and SP3. For example, the first to third semiconductor patterns SP1, SP2, and SP3 may connect two adjacent patterns of the source/drain patterns SD1, SD2, SD3, and SD4 to each other.

The first to third semiconductor patterns SP1, SP2, and SP3 may be formed of or include silicon (Si), germanium (Ge), or silicon-germanium (SiGe). In an implementation, as illustrated in the drawings, the channel pattern CH may include the first to third semiconductor patterns SP1, SP2, and SP3, or a different number of semiconductor patterns.

Widths of the first to third semiconductor patterns SP1, SP2, and SP3 of the channel pattern CH on (e.g., aligned with in the third direction D3) the first active pattern AP1, measured in the first direction D1, may be substantially equal to the first width W1. Widths of the first to third semiconductor patterns SP1, SP2, and SP3 of the channel pattern CH on the second active pattern AP2, measured in the first direction D1, may be substantially equal to the second width W2. Widths of the first to third semiconductor patterns SP1, SP2, and SP3 of the channel pattern CH on the third active pattern AP3, measured in the first direction D1, may be substantially equal to the third width W3. Widths of the first to third semiconductor patterns SP1, SP2, and SP3 of the channel pattern CH on the fourth active pattern AP4, measured in the first direction D1, may be substantially equal to the fourth width W4. For example, the widths of the first to third semiconductor patterns SP1, SP2, and SP3 of the channel pattern CH on the second active pattern AP2 in the first direction D1 may be at least two times the widths of the first to third semiconductor patterns SP1, SP2, and SP3 of the channel pattern CH on the first active pattern AP1 in the first direction D1.

In an implementation, each of the first to fourth active patterns AP1, AP2, AP3, and AP4 may include active fins, instead of the channel patterns CH. The semiconductor device including the active fins will be described in more detail below.

Each of the source/drain patterns SD1, SD2, SD3, and SD4 may be an epitaxial pattern, which is formed using the active patterns AP1, AP2, AP3, and AP4 and the first to third semiconductor patterns SP1, SP2, and SP3 of the channel pattern CH, which correspond to the same, as a seed layer.

The first and third source/drain patterns SD1 and SD3 may be p-type impurity regions. The first and third source/ drain patterns SD1 and SD3 may include a material, which can exert a compressive stress on the channel pattern CH. For example, the first and third source/drain patterns SD1 and SD3 may include a semiconductor material (e.g., SiGe), whose lattice constant is greater than that of the substrate 100.

The second and fourth source/drain patterns SD2 and SD4 may be n-type impurity regions. The second and fourth source/drain patterns SD2 and SD4 may include a semiconductor material, whose lattice constant is smaller than that of the substrate 100. In an implementation, the second and fourth source/drain patterns SD2 and SD4 may include the same semiconductor material (e.g., Si) as that of the substrate 100.

A largest width of the first source/drain pattern SD1 in the first direction D1 may be defined as a fifth width W5. A largest width of the second source/drain pattern SD2 in the first direction D1 may be defined as a sixth width W6. A largest width of the third source/drain pattern SD3 in the first direction D1 may be defined as a seventh width W7. A largest width of the fourth source/drain pattern SD4 in the first direction D1 may be defined as an eighth width W8. The sixth width W6 may be at least two times the fifth width W5. The sixth width W6 may be at least two times the eighth width W8. The seventh width W7 may be at least two times the fifth width W5. The seventh width W7 may be at least two times the eighth width W8.

Gate electrodes GE may cross the channel patterns CH and extend in the first direction D1. The gate electrodes GE may be spaced apart from each other in the second direction D2. The gate electrodes GE may be vertically overlapped with the channel patterns CH. In an implementation, the gate electrode GE may be formed of or include conductive metal nitrides (e.g., titanium nitride or tantalum nitride) or metallic materials (e.g., titanium, tantalum, tungsten, copper, or aluminum).

The gate electrode GE may surround each of the first to third semiconductor patterns SP1, SP2, and SP3 of the channel pattern CH. For example, the gate electrode GE may cover or face a top surface, a bottom surface, and opposite side surfaces of each of the first to third semiconductor patterns SP1, SP2, and SP3 (e.g., see FIGS. 1C, 1D, and 1E). For example, the first and second transistors may be gate-all-around type field effect transistors.

The gate electrode GE may include first to fourth portions GP1, GP2, GP3, and GP4. The first to fourth portions GP1-GP4 of the gate electrode GE may be on each of the first to fourth active patterns AP1, AP2, AP3, and AP4. The first portion GP1 may be between each of the first to fourth active patterns AP1, AP2, AP3, and AP4 and the first semiconductor pattern SP1, the second portion GP2 may be between the first semiconductor pattern SP1 and the second semiconductor pattern SP2, the third portion GP3 may be between the second semiconductor pattern SP2 and the third semiconductor pattern SP3, and the fourth portion GP4 may be on the third semiconductor pattern SP3.

For example, a width of the first to fourth portions GP1, GP2, GP3, and GP4 on the second active pattern AP2 in the first direction D1 may be at least two times a width of the first to fourth portions GP1, GP2, GP3, and GP4 on the first active pattern AP1 in the first direction D1.

An insulating pattern IL may be between the gate electrodes GE. Due to the insulating pattern IL, the gate electrodes GE may be spaced apart from each other in the first direction D1. The insulating pattern IL may be between a pair of the first active patterns AP1. The insulating pattern IL may be between a pair of the fourth active patterns AP4.

Figure 1C:
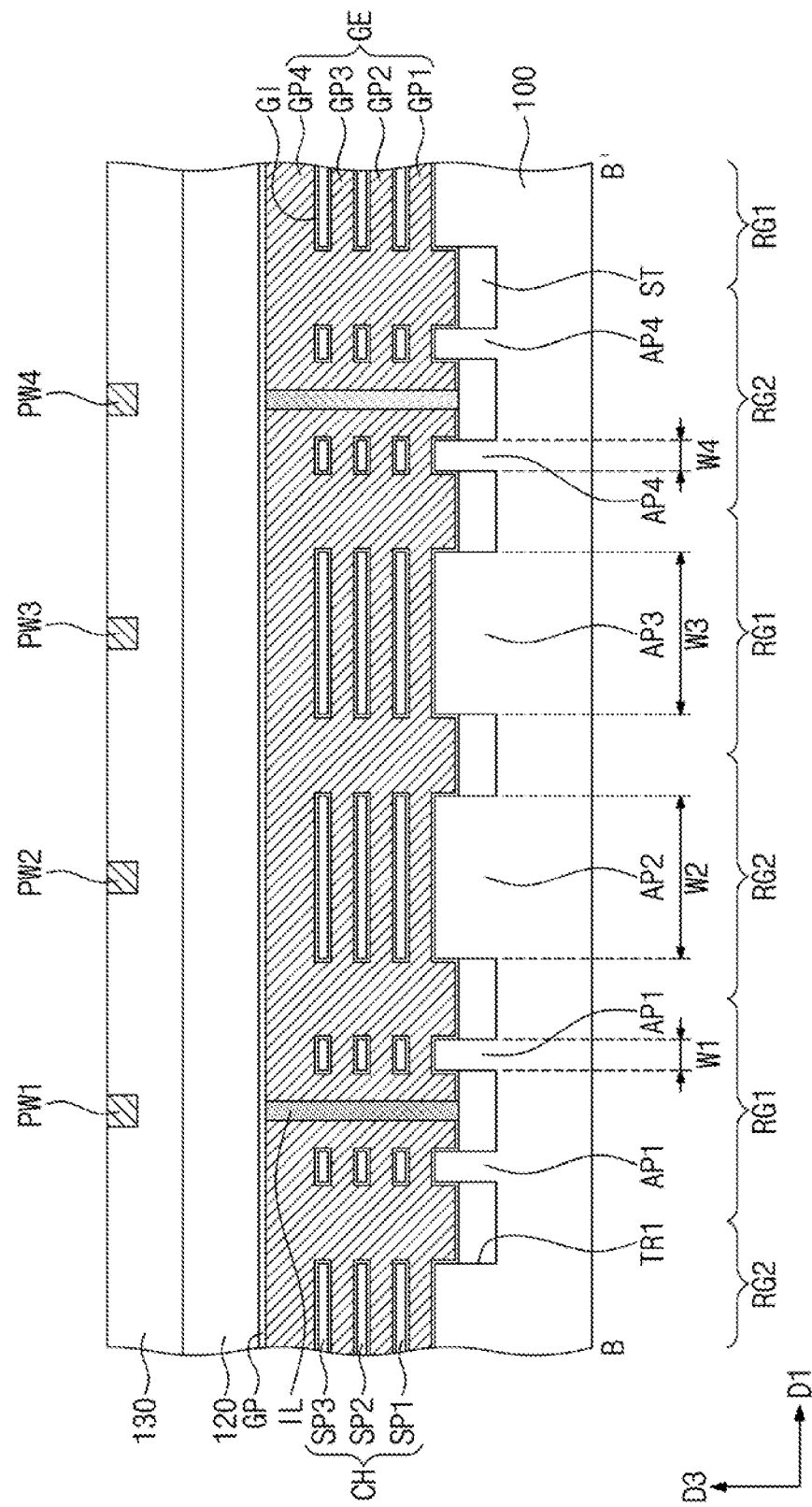
Figure 1D:
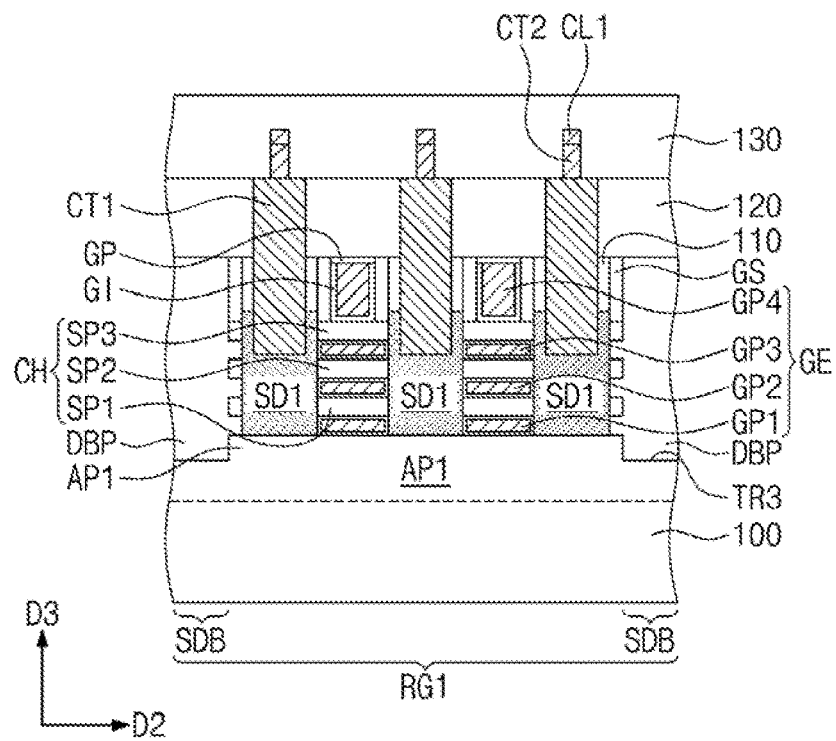
Figure 1E:
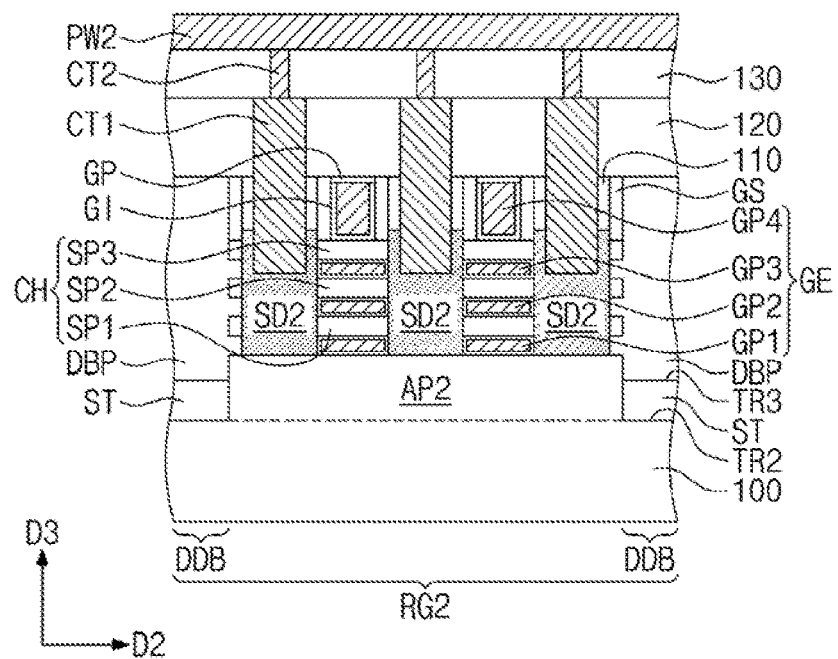

One first active pattern AP1, one second active pattern AP2, one third active pattern AP3, and one fourth active pattern AP4 may be between each adjacent pair of the insulating patterns IL (e.g., see FIG. 1C).

A pair of gate spacers GS may be on opposite side surfaces of each of the gate electrodes GE. The gate spacers GS may be extended along the gate electrode GE and in the first direction D1. Top surfaces of the gate spacers GS may be higher (e.g., farther from the substrate 100 in the third direction D3) than a top surface of the gate electrode GE. The top surfaces of the gate spacers GS may be coplanar with a top surface of a first interlayered insulating layer 110, which will be described below. The gate spacers GS may be formed of or include SiCN, SiCON, or SiN. In an implementation, the gate spacers GS may have a multi-layered structure, which includes at least two different materials selected from SiCN, SiCON, and SiN.

Gate dielectric patterns GI may be between the gate electrodes GE and the channel patterns CH. The gate dielectric pattern GI may surround each of the first to third semiconductor patterns SP1, SP2, and SP3. The gate dielectric pattern GI may be between the gate electrode GE and each of the first to third semiconductor patterns SP1, SP2, and SP3. The gate dielectric pattern GI may be formed of or include a high-k dielectric material. The high-k dielectric materials may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A gate capping pattern GP may be on each of the gate electrodes GE. The gate capping pattern GP may extend along the gate electrode GE and in the first direction D1. The gate capping pattern GP may be formed of or include a material that is selected to have an etch selectivity with respect to the first interlayered insulating layer 110, which will be described below. For example, the gate capping patterns GP may be formed of or include SiON, SiCN, SiCON, or SiN.

The first interlayered insulating layer 110 may be on the substrate 100. The first interlayered insulating layer 110 may cover the device isolation layer ST, the gate electrodes GE, and the first to fourth source/drain patterns SD1, SD2, SD3, and SD4. A top surface of the first interlayered insulating layer 110 may be substantially coplanar with top surfaces of the gate capping patterns GP. The top surface of the first interlayered insulating layer 110 may be substantially coplanar with top surfaces of the diffusion blocking patterns DBP. A second interlayered insulating layer 120 may be on the first interlayered insulating layer 110. For example, the first and second interlayered insulating layers 110 and 120 may be formed of or include silicon oxide or silicon oxynitride.

First contacts CT1 may penetrate the first and second interlayered insulating layers 110 and 120 and may be connected to the first to fourth source/drain patterns SD1, SD2, SD3, and SD4, respectively. For example, the first contacts CT1 may be formed of or include a metallic material (e.g., titanium, tantalum, tungsten, copper, or aluminum).

A third interlayered insulating layer 130 may be on the second interlayered insulating layer 120. For example, the third interlayered insulating layer 130 may be formed of or include silicon oxide or silicon oxynitride.

Second contacts CT2 may penetrate the third interlayered insulating layer 130 and may be connected to the first contacts CT1, respectively. In an implementation, the second contacts CT2 may be formed of or include a metallic material (e.g., titanium, tantalum, tungsten, copper, or aluminum).

First conductive lines CL1, second conductive lines CL2, a first power rail PW1, a second power rail PW2, a third power rail PW3, and a fourth power rail PW4 may be in the third interlayered insulating layer 130. Each of the first conductive lines CL1 may connect the second contacts CT2, which are connected to the first source/drain patterns SD1, to each other. The second conductive lines CL2 may connect the second contacts CT2, which are connected to the fourth source/drain patterns SD4, to each other.

The first to fourth power rails PW1, PW2, PW3, and PW4 may extend in the second direction D2. The first power rail PW1 may be connected to the first source/drain patterns SD1 through the first conductive lines CL1 and the second contacts CT2. The second power rail PW2 may be connected to the second source/drain patterns SD2 through the second contacts CT2. The third power rail PW3 may be connected to the third source/drain patterns SD3 through the second contacts CT2. The fourth power rail PW4 may be connected to the fourth source/drain patterns SD4 through the second conductive lines CL2 and the second contacts CT2. The first power rail PW1 connected to the first source/drain patterns SD1 may not be vertically overlapped with the first active patterns AP1 (e.g., may not overlie the first active patterns AP1 in the third direction D3). The first power rail PW1 may be between a pair of the first active patterns AP1, when viewed in a plan view. The first power rail PW1 may be connected to a pair of the first active patterns AP1. The second power rail PW2, which is connected to the second source/drain patterns SD2, may be vertically overlapped with the second active pattern AP2. The second power rail PW2 may be connected to one second active pattern AP2. The third power rail PW3, which is connected to the third source/drain patterns SD3, may be vertically overlapped with the third active pattern AP3. The third power rail PW3 may be connected to one third active pattern AP3. The fourth power rail PW4, which is connected to the fourth source/drain patterns SD4, may not be vertically overlapped with the fourth active patterns AP4. The fourth power rail PW4 may be between a pair of the fourth active patterns AP4, when viewed in a plan view. The fourth power rail PW4 may be connected to a pair of the fourth active patterns AP4.

In an implementation, the second and third active patterns AP2 and AP3 and the channel patterns CH on the second and third active patterns AP2 and AP3 may have relatively large widths in the first direction D1, and this may make it possible to improve electric characteristics of the semiconductor device.

Figure 2A:
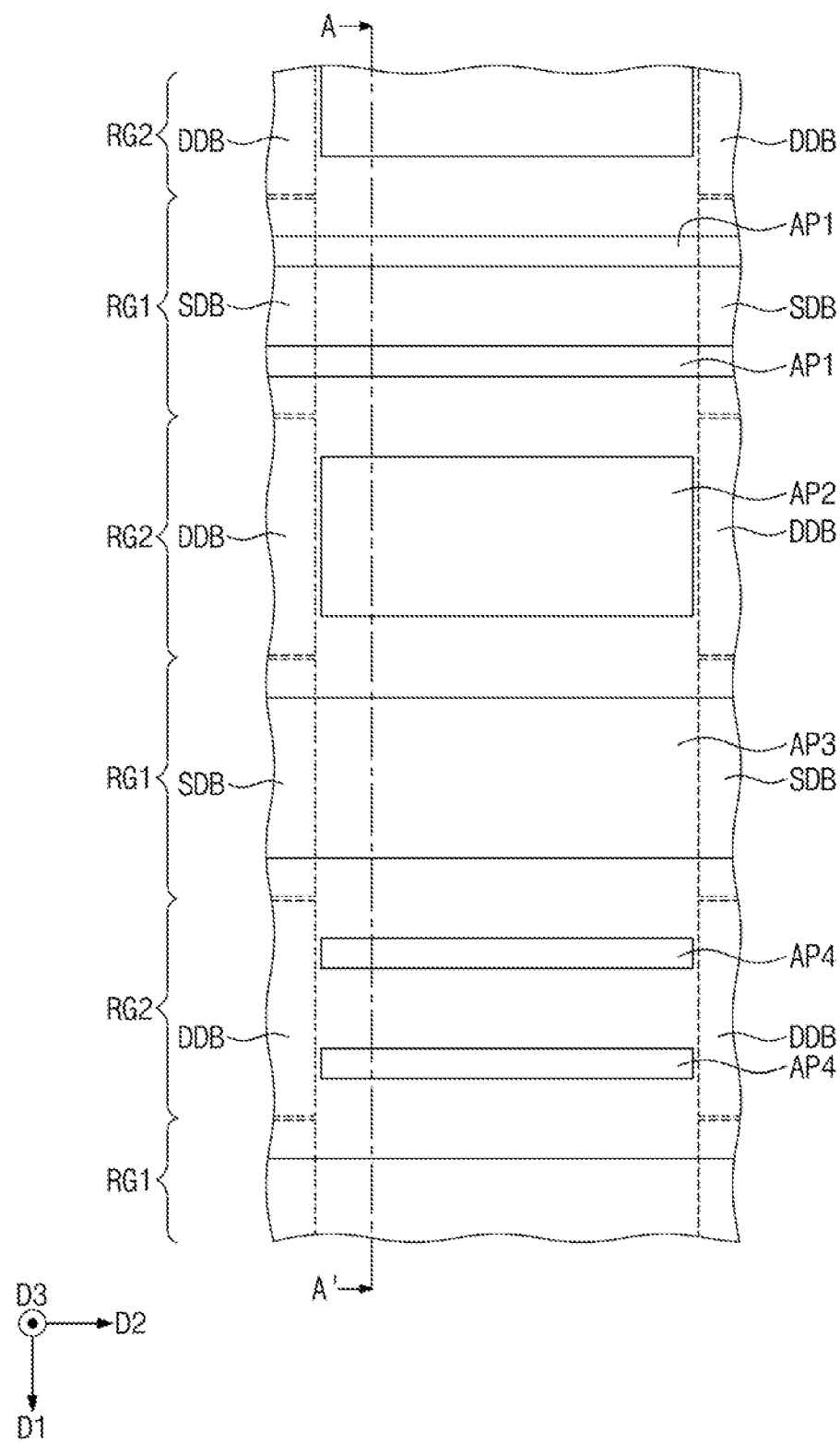
FIGS. 2A and 3A illustrate plan views of stages in a method of fabricating a semiconductor device, according to an embodiment.
Figure 2B:
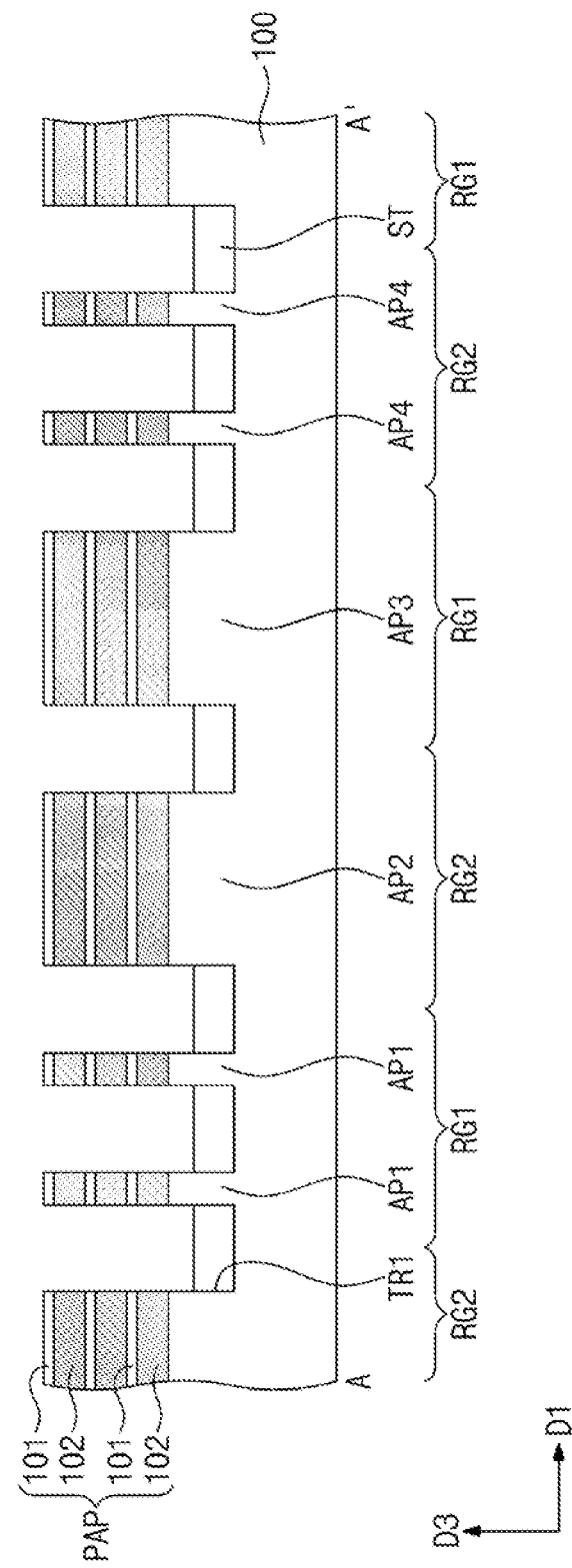
FIGS. 2B and 3B illustrate sectional views taken along lines A-A' of FIGS. 2A and 3A, respectively.
Figure 3A:
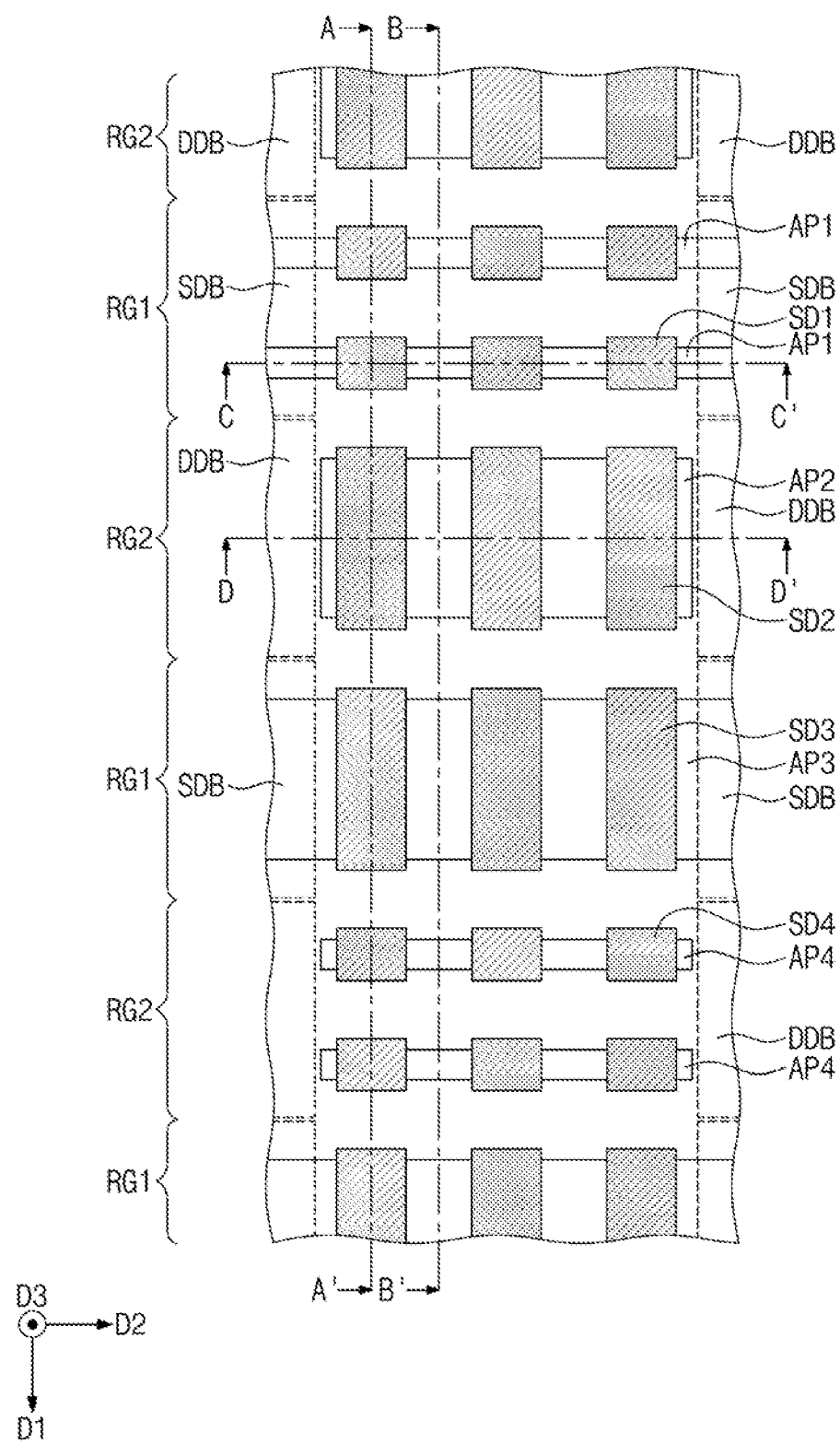
Figure 3B:
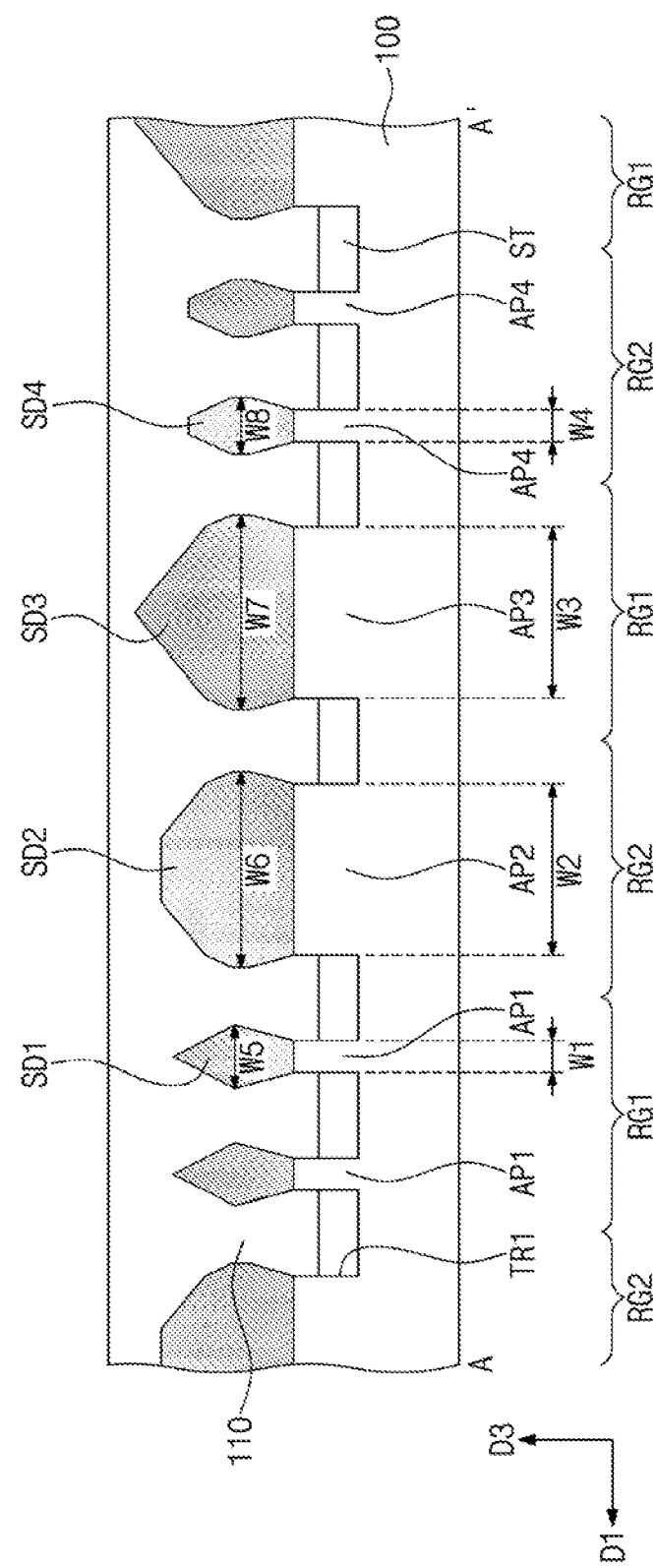
Figure 3C:
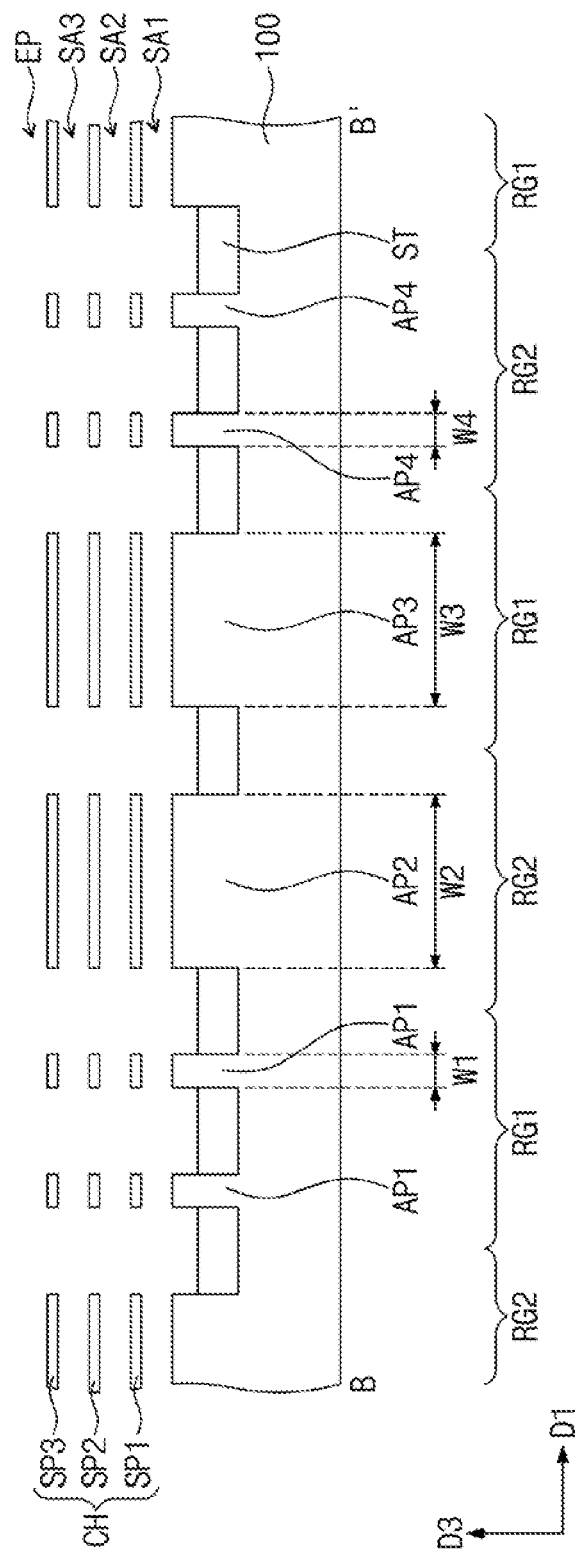
FIGS. 3C, 3D, and 3E illustrate sectional views taken along lines B-B', C-C', and D-D', respectively, of FIG. 3A.
Figure 3D:
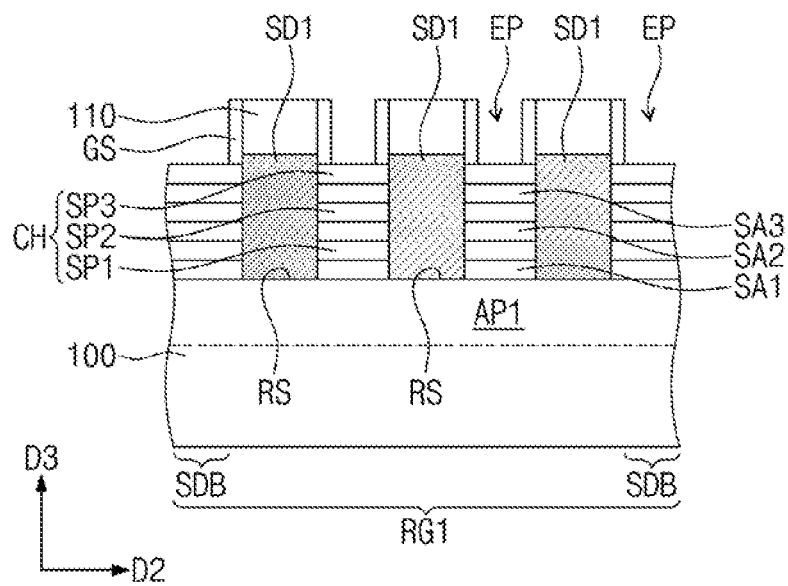
Figure 3E:
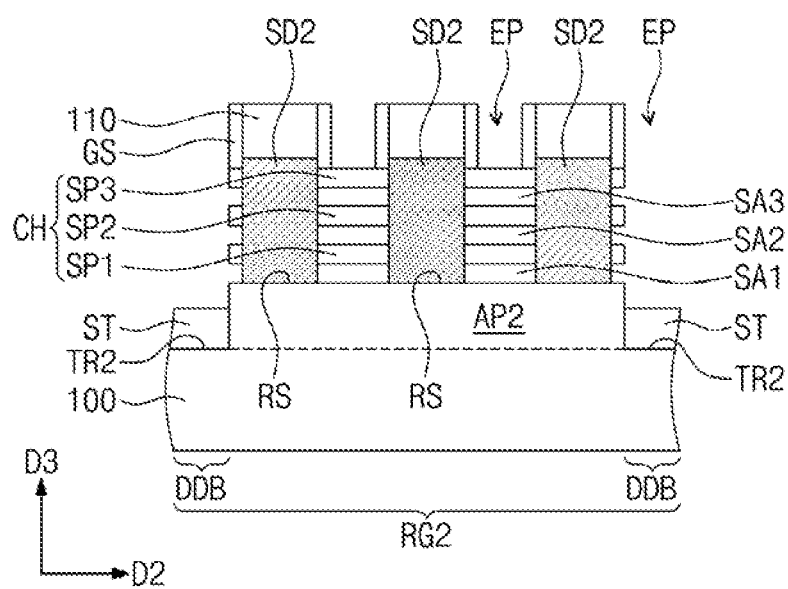

FIGS. 2A and 3A illustrate plan views of stages in a method of fabricating a semiconductor device, according to an embodiment. FIGS. 2B and 3B illustrate sectional views taken along lines A-A' of FIGS. 2A and 3A, respectively. FIGS. 3C, 3D, and 3E illustrate sectional views taken along lines B-B', C-C', and D-D', respectively, of FIG. 3A.

Referring to FIGS. 2A and 2B, the first to fourth active patterns AP1, AP2, AP3, and AP4 and preliminary patterns PAP may be formed. The formation of the first to fourth active patterns AP1, AP2, AP3, and AP4 and the preliminary patterns PAP may include alternately and repeatedly stacking sacrificial layers 102 and semiconductor layers 101 on the substrate 100 and forming the first trenches TR1.

The sacrificial layers 102 may be formed of or include a material that is selected to have an etch selectivity with respect to the semiconductor layers 101. For example, the semiconductor layers 101 may be formed of or include a material, which is hardly etched in a process of etching the sacrificial layers 102. In an implementation, in the process of etching the sacrificial layers 102, a ratio of an etch rate of the sacrificial layers 102 to an etch rate of the semiconductor layers 101 may range from 10:1 to 200:1. In an implementation, the sacrificial layers 102 may be formed of or include silicon-germanium (SiGe) or germanium (Ge), and the semiconductor layers 101 may be formed of or include silicon (Si).

The sacrificial layers 102 and the semiconductor layers 101 may be formed by an epitaxial growth process, in which the substrate 100 is used as a seed layer. The sacrificial layers 102 and the semiconductor layers 101 may be successively formed in the same chamber. Each of the sacrificial layers 102 and the semiconductor layers 101 may be conformally grown on the substrate 100.

The formation of the first trench TR1 may include patterning the sacrificial layers 102, the semiconductor layers 101, and the substrate 100. As a result of the patterning of the sacrificial layers 102, the semiconductor layers 101, and the substrate 100, the first trenches TR1 may extend in the second direction D2. The substrate 100 may be patterned to define the first to fourth active patterns AP1, AP2, AP3, and AP4 between the first trenches TR1. The sacrificial layers 102 and the semiconductor layers 101 may be patterned to form the preliminary patterns PAP on each of the first to fourth active patterns AP1, AP2, AP3, and AP4. Each of the preliminary patterns PAP may include the patterned portions of the sacrificial layers 102 and the semiconductor layers 101. Each of the preliminary patterns PAP may be vertically overlapped with each of the first to fourth active patterns AP1, AP2, AP3, and AP4.

The first to fourth active patterns AP1, AP2, AP3, and AP4 and the preliminary patterns PAP may have a line or bar shape extending in the second direction D2.

The second trenches TR2 may be formed by patterning the second active pattern AP2, the fourth active patterns AP4, and the preliminary patterns PAP on the second and fourth active patterns AP2 and AP4. The second trenches TR2 may be formed on the double diffusion blocking regions DDB, which are on the second regions RG2 of the substrate 100.

The device isolation layer ST may fill the first and second trenches TR1 and TR2. The formation of the device isolation layer ST may include forming an insulating layer on the substrate 100 and recessing the insulating layer to completely expose the preliminary patterns PAP. As a result, the device isolation layer ST may have the top surface that is lower than top surfaces of the first to fourth active patterns AP1, AP2, AP3, and AP4.

Referring to FIGS. 3A, 3B, 3C, 3D, and 3E, the source/drain patterns SD1, SD2, SD3, and SD4 and the channel patterns CH may be formed.

The formation of the source/drain patterns SD1, SD2, SD3, and SD4 and the channel patterns CH may include forming sacrificial patterns to cross the preliminary patterns PAP, forming a pair of the gate spacers GS on opposite side surfaces of each of the sacrificial patterns, etching the preliminary patterns PAP using the sacrificial patterns and the gate spacers GS as a mask, and forming the source/drain patterns SD1, SD2, SD3, and SD4 using an epitaxial growth process.

The sacrificial patterns may have a line or bar shape extending in the first direction D1. The sacrificial patterns may be formed of or include polysilicon.

The formation of the gate spacers GS may include conformally forming a spacer layer on the substrate 100 and performing an anisotropic etching process on the spacer layer.

The channel patterns CH may be formed by patterning the preliminary patterns PAP using the sacrificial patterns and the gate spacers GS as a mask. The semiconductor layers 101 of the preliminary patterns PAP may be patterned to form the first to third semiconductor patterns SP1, SP2, and SP3.

Recesses RS may be formed by patterning the preliminary patterns PAP using the sacrificial patterns and the gate spacers GS as a mask. The channel pattern CH may be between an adjacent pair of the recesses RS.

The source/drain patterns SD1, SD2, SD3, and SD4 may fill the recesses RS. The formation of the source/drain patterns SD1, SD2, SD3, and SD4 may include performing a selective epitaxial process, in which each of the active patterns AP1, AP2, AP3, and AP4 and the first to third semiconductor patterns SP1, SP2, and SP3 are used as a seed layer.

During or after the selective epitaxial process, the first and third source/drain patterns SD1 and SD3 may be doped with p-type impurities, and the second and fourth source/drain patterns SD2 and SD4 may be doped with n-type impurities.

The first interlayered insulating layer 110 may be formed on the substrate 100 to cover the source/drain patterns SD1, SD2, SD3, and SD4 and the device isolation layer ST. A planarization process on the first interlayered insulating layer 110 may be performed to expose the sacrificial patterns.

The sacrificial patterns exposed by the planarization process may be removed. As a result of the removal of the sacrificial patterns, an empty space EP may be formed between a pair of the gate spacers GS. The empty spaces EP may expose the channel patterns CH and the sacrificial layers 102 between the channel patterns CH.

The sacrificial layers 102 exposed by the empty spaces EP may be removed. As a result of the removal of the sacrificial layers 102, a first cavity SA1 may be formed between each of the active patterns AP1, AP2, AP3, and AP4 and the first semiconductor pattern SP1, a second cavity SA2 may be formed between the first semiconductor pattern SP1 and the second semiconductor pattern SP2, and a third cavity SA3 may be formed between the second semiconductor pattern SP2 and the third semiconductor pattern SP3. Side surfaces of the source/drain patterns SD1, SD2, SD3, and SD4 may be partially exposed through the first to third cavities SA1, SA2, and SA3.

Referring back to FIGS. 1A, 1B, 1C, 1D, and 1E, the gate dielectric pattern GI and the gate electrode GE may be formed in the empty spaces EP and the first to third cavities SA1, SA2, and SA3. The formation of the gate dielectric pattern GI and the gate electrode GE may include conformally forming a gate dielectric layer in the empty spaces EP and the first to third cavities SA1, SA2, and SA3 and forming a gate electrode layer to completely fill the empty spaces EP and the first to third cavities SA1, SA2, and SA3. Portions of the gate electrode layer filling the first to third cavities SA1, SA2, and SA3 may be used as the first to third portions GP1, GP2, and GP3, respectively, of the gate electrode GE.

The gate capping patterns GP may be formed on the gate electrodes GE.

The third trenches TR3 may be formed on the double diffusion blocking regions DDB and the single diffusion blocking regions SDB. The formation of the third trenches TR3 may include removing the gate electrode layer on the double diffusion blocking regions DDB, and removing the gate electrode layer, the channel patterns CH, and portions of the active patterns AP1, AP2, AP3, and AP4 on the single diffusion blocking regions SDB. The diffusion blocking pattern DBP may fill the third trench TR3.

The second interlayered insulating layer 120 may be formed on the first interlayered insulating layer 110, the gate capping patterns GP, and the diffusion blocking patterns DBP. The first contacts CT1 may penetrate the first and second interlayered insulating layers 110 and 120 and to be connected to the source/drain patterns SD1, SD2, SD3, and SD4. The third interlayered insulating layer 130 may be formed on the second interlayered insulating layer 120. The second contacts CT2, the first and second conductive lines CL1 and CL2, and the first to fourth power rails PW1, PW2, PW3, and PW4 may be formed in the third interlayered insulating layer 130.

FIGS. 4A, 5A, 6A, 7A, and 8A illustrate plan views of a semiconductor device according to an embodiment. FIGS. 4B, 5B, 6B, 7B, and 8B illustrate sectional views taken along lines A-A' of FIGS. 4A, 5A, 6A, 7A, and 8A, respectively. FIGS. 4C, 5C, 6C, 7C, and 8C illustrate sectional views taken along lines B-B' of FIGS. 4A, 5A, 6A, 7A, and 8A, respectively. For concise description, an element described above may be identified by the same reference number without repeating an overlapping description thereof.

Figure 4A:
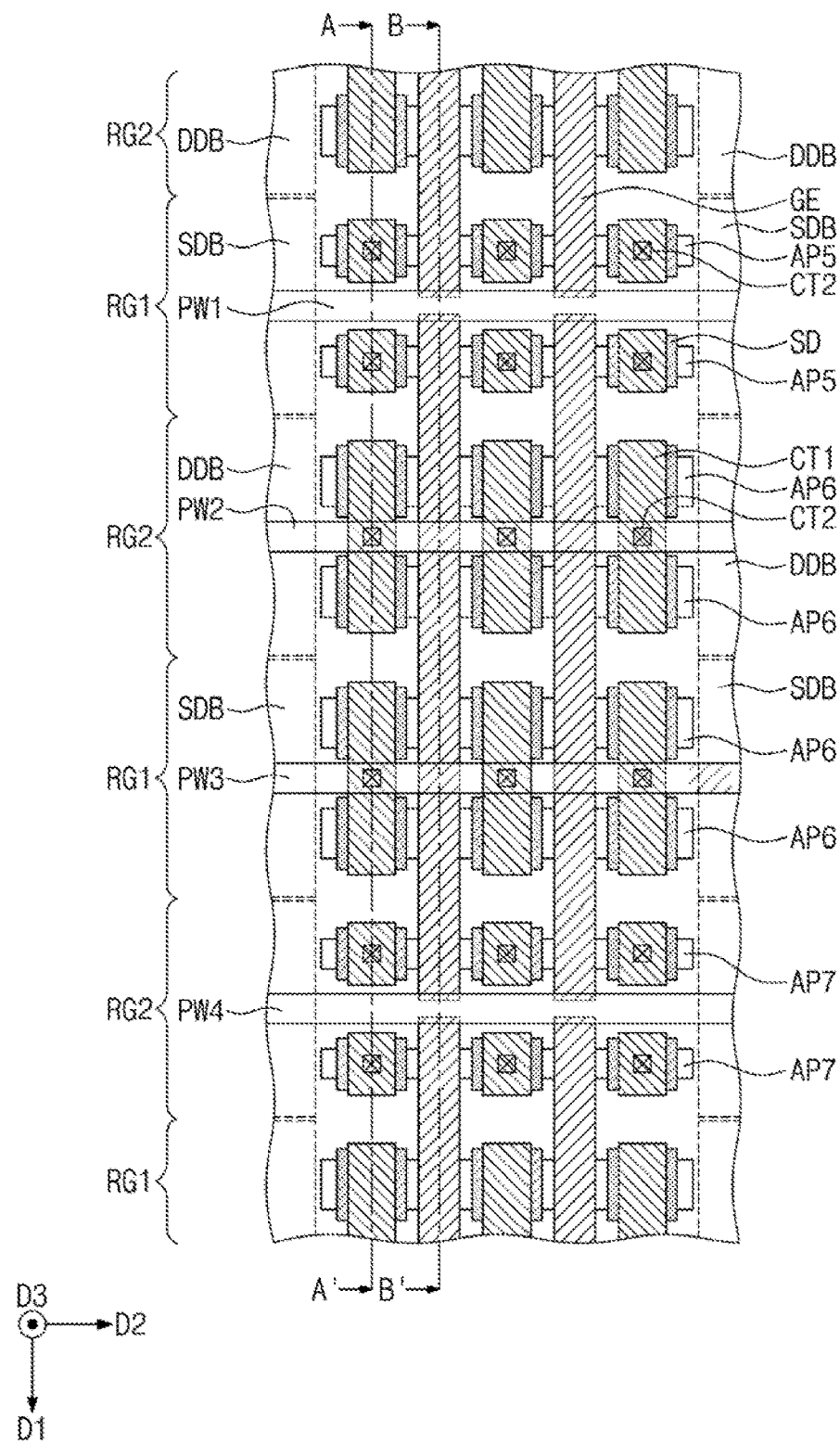
FIGS. 4A, 5A, 6A, 7A, and 8A illustrate plan views, each of which illustrates a semiconductor device according to an embodiment.
Figure 4B:
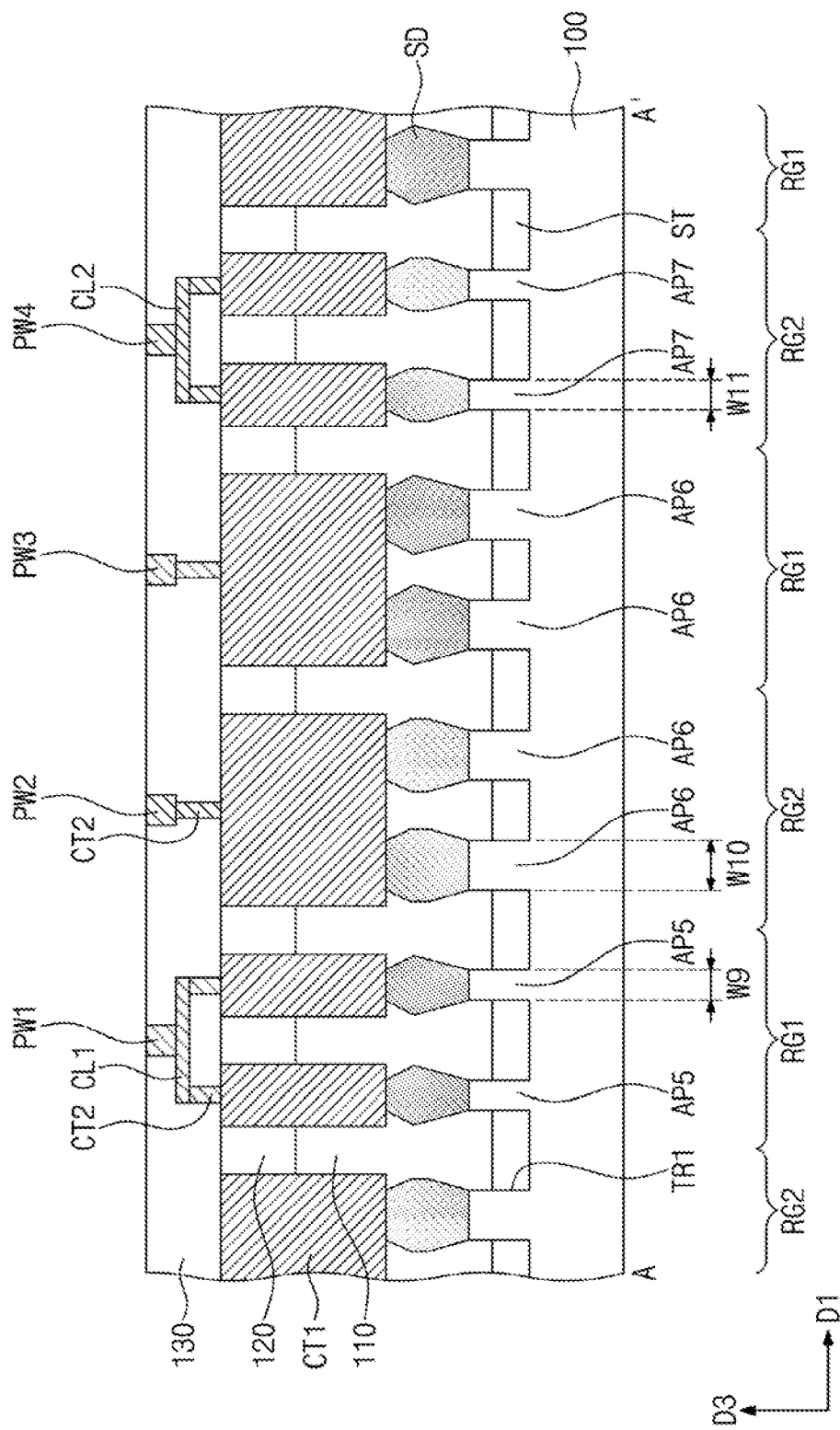
FIGS. 4B, 5B, 6B, 7B, and 8B illustrate sectional views taken along lines A-A' of FIGS. 4A, 5A, 6A, 7A, and 8A, respectively.
Figure 4C:
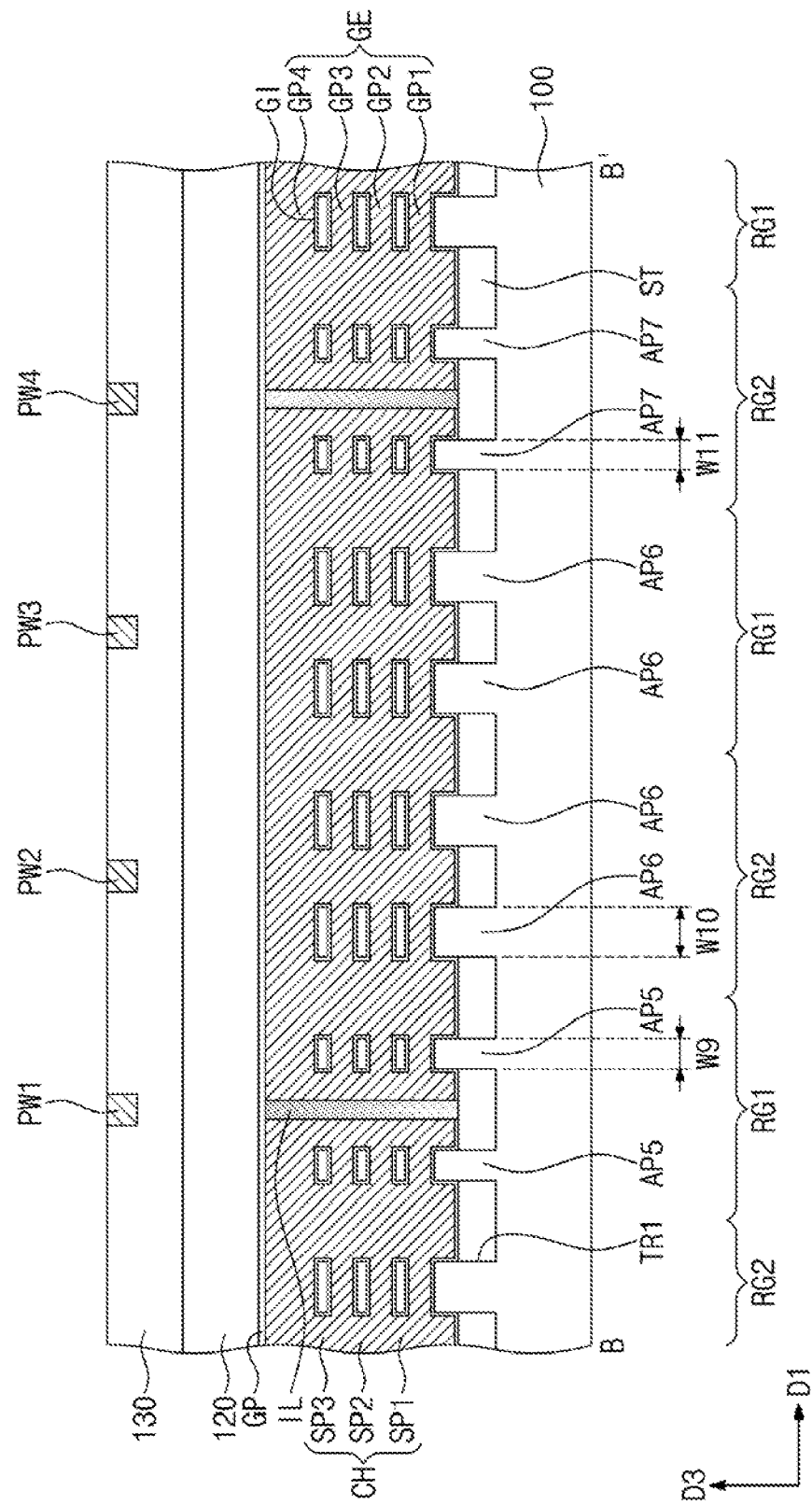
FIGS. 4C, 5C, 6C, 7C, and 8C illustrate sectional views taken along lines B-B' of FIGS. 4A, 5A, 6A, 7A, and 8A, respectively.

Referring to FIGS. 4A, 4B, and 4C, a semiconductor device according to the present embodiment may include fifth, sixth and seventh active patterns AP5, AP6, and AP7, which are defined in an upper portion of the substrate 100. A plurality of the sixth active patterns AP6 may be between a pair of the fifth active patterns AP5 and a pair of the seventh active patterns AP7. For example, the pair of the fifth active patterns AP5, the plurality of the sixth active patterns AP6, and the pair of the seventh active patterns AP7 may be sequentially arranged in the first direction D1.

A width of the fifth active pattern AP5 in the first direction D1 may be defined as a ninth width W9, a width of the sixth active pattern AP6 in the first direction D1 may be defined as a tenth width W10, and a width of the seventh active pattern AP7 in the first direction D1 may be defined as an eleventh width W11. The tenth width W10 may be greater than the ninth width W9. The tenth width W10 may be greater than the eleventh width W11. The ninth width W9 and the eleventh width W11 may be substantially equal to each other.

In an implementation, a structure, in which active patterns with relatively large widths (i.e., the sixth active patterns AP6) are between a pair of active patterns with relatively small widths (i.e., the fifth active patterns AP5) and a pair of active patterns with relatively small widths (i.e., the seventh active patterns AP7), may be repeated in the semiconductor device.

One fifth active pattern AP5 and one seventh active pattern AP7 may be between each adjacent pair of the insulating patterns IL, and a plurality of the sixth active patterns AP6 may be between the fifth and seventh active patterns AP5 and AP7 (e.g., see FIG. 4C).

Each of the fifth active patterns AP5 may be connected to a corresponding one of the first contacts CT1. For example, one fifth active pattern AP5 may be connected to one first contact CT1. A pair of the sixth active patterns AP6 may be connected to a corresponding one of the first contacts CT1. For example, two sixth active patterns AP6 may be connected to one first contact CT1. Each of the seventh active patterns AP7 may be connected to a corresponding one of the first contacts CT1. For example, one seventh active pattern AP7 may be connected to one first contact CT1.

Figure 5A:
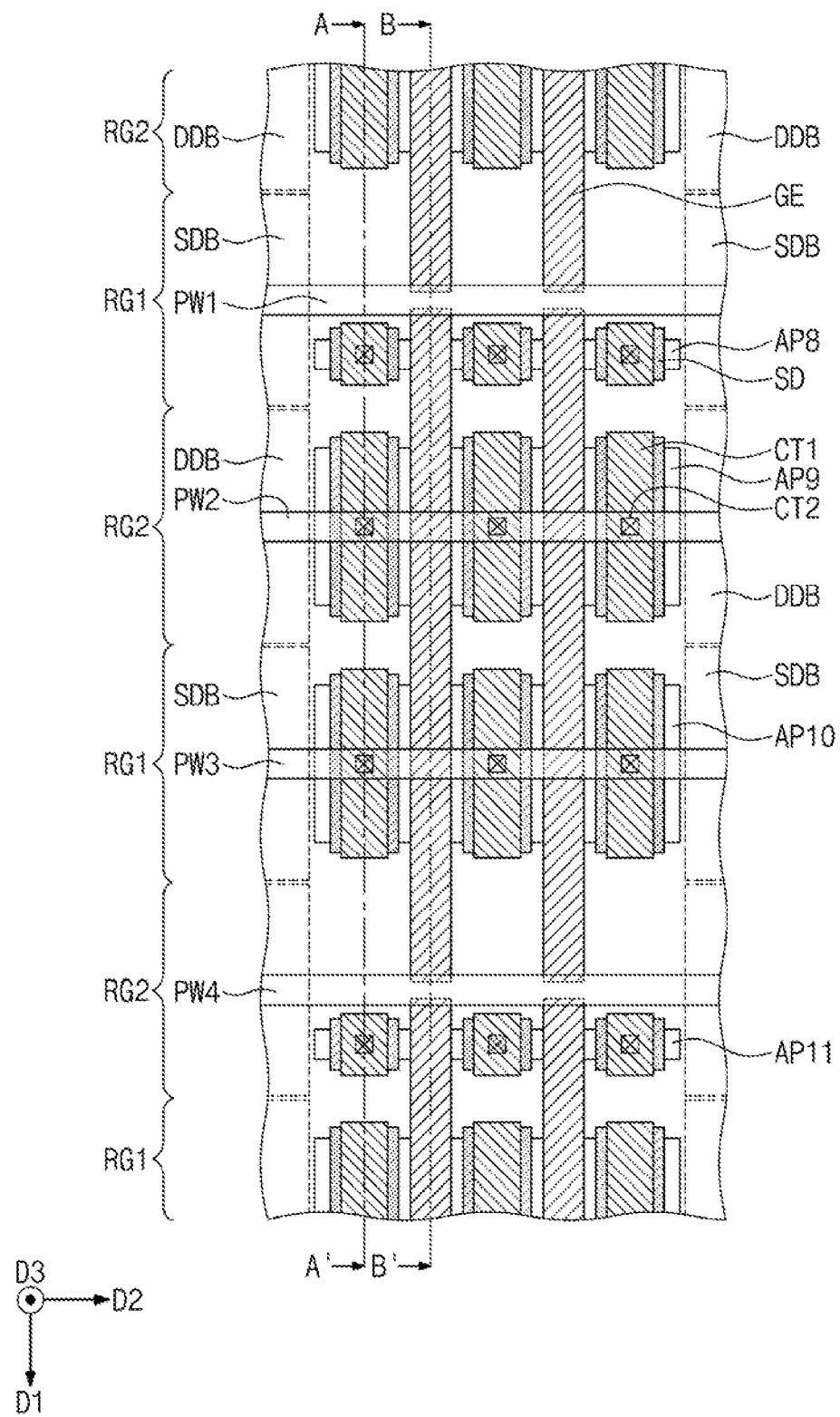
Figure 5B:
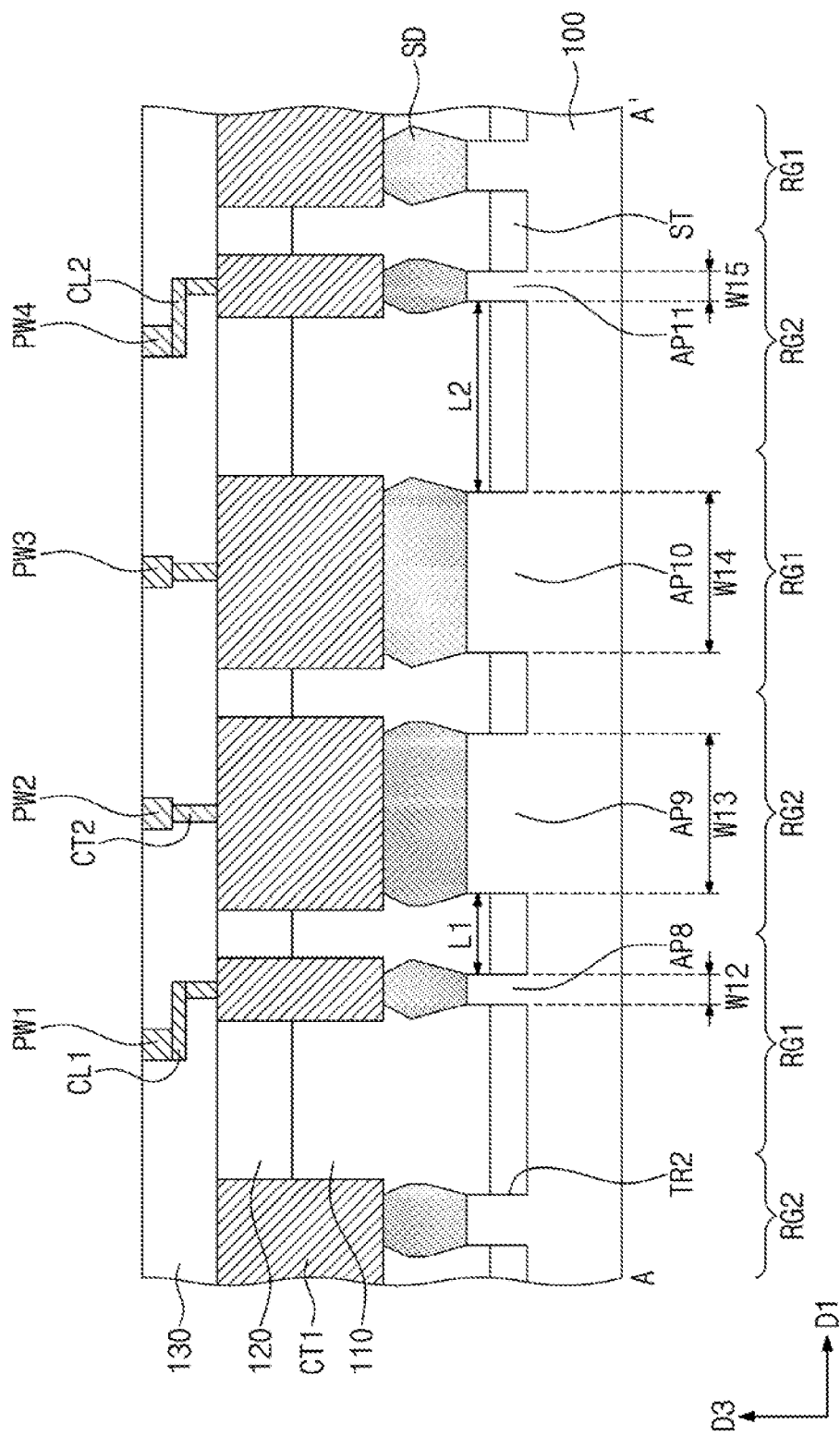
Figure 5C:
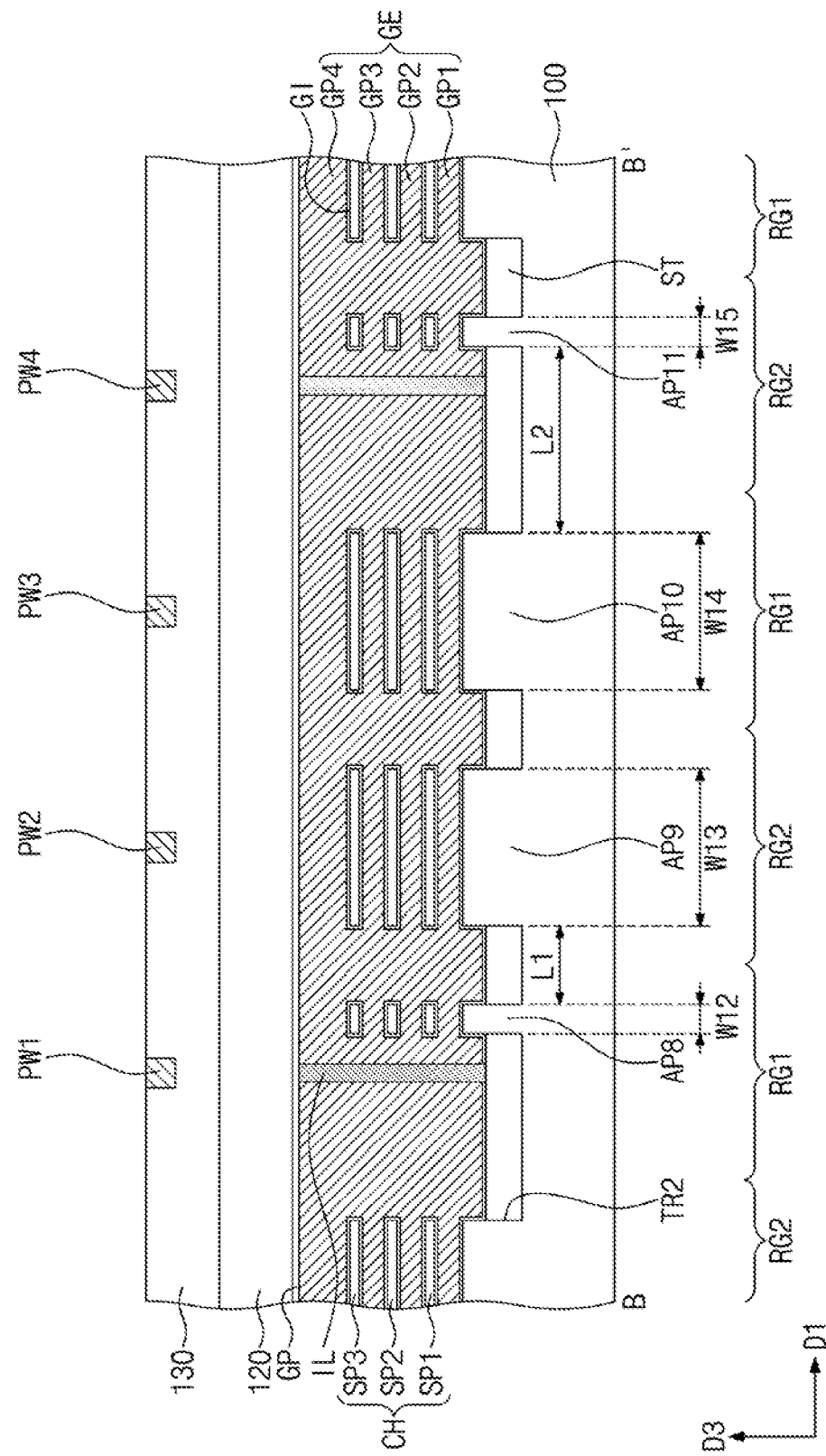

Referring to FIGS. 5A, 5B, and 5C, a semiconductor device according to the present embodiment may include eighth, ninth, tenth, and eleventh active patterns AP8, AP9, AP10, and AP11, which are defined in an upper portion of the substrate 100. The eighth to eleventh active patterns AP8, AP9, AP10, and AP11 may be sequentially arranged in the first direction D1.

A width of the eighth active pattern AP8 in the first direction D1 may be defined as a twelfth width W12, a width of the ninth active pattern AP9 in the first direction D1 may be defined as a thirteenth width W13, a width of the tenth active pattern AP10 in the first direction D1 may be defined as a fourteenth width W14, and a width of the eleventh active pattern AP11 in the first direction D1 may be defined as a fifteenth width W15. The thirteenth width W13 may be at least two times the twelfth width W12. The thirteenth width W13 may be at least two times the fifteenth width W15. The fourteenth width W14 may be at least two times the twelfth width W12. The fourteenth width W14 may be at least two times the fifteenth width W15. The twelfth width W12 and the fifteenth width W15 may be substantially equal to each other. The thirteenth width W13 and the fourteenth width W14 may be substantially equal to each other.

In an implementation, a structure, in which active patterns with relatively large widths (e.g., the ninth and tenth active patterns AP9 and AP10) are between an active pattern with a relatively small width (i.e., the eighth active pattern AP8) and an active pattern with a relatively small width (i.e., the eleventh active pattern AP11), may be repeated in the semiconductor device.

One eighth active pattern AP8, one ninth active pattern AP9, and one tenth active pattern AP10 may be between each adjacent pair of the insulating patterns IL (e.g., see FIG. 5C).

When measured in the first direction D1, the shortest distance between the eighth active pattern AP8 and the ninth active pattern AP9 may be defined as a first distance L1. When measured in the first direction D1, the shortest distance between the tenth active pattern AP10 and the eleventh active pattern AP11 may be defined as a second distance L2. The second distance L2 may be at least two times the first distance L1.

The eighth active pattern AP8 may not be vertically overlapped with the first power rail PW1. The first power rail PW1 may be connected to one eighth active pattern AP8. The ninth active pattern AP9 may be vertically overlapped with the second power rail PW2. The tenth active pattern AP10 may be vertically overlapped with the third power rail PW3. The eleventh active pattern AP11 may not be vertically overlapped with the fourth power rail PW4. The fourth power rail PW4 may be connected to one eleventh active pattern AP11.

Figure 6A:
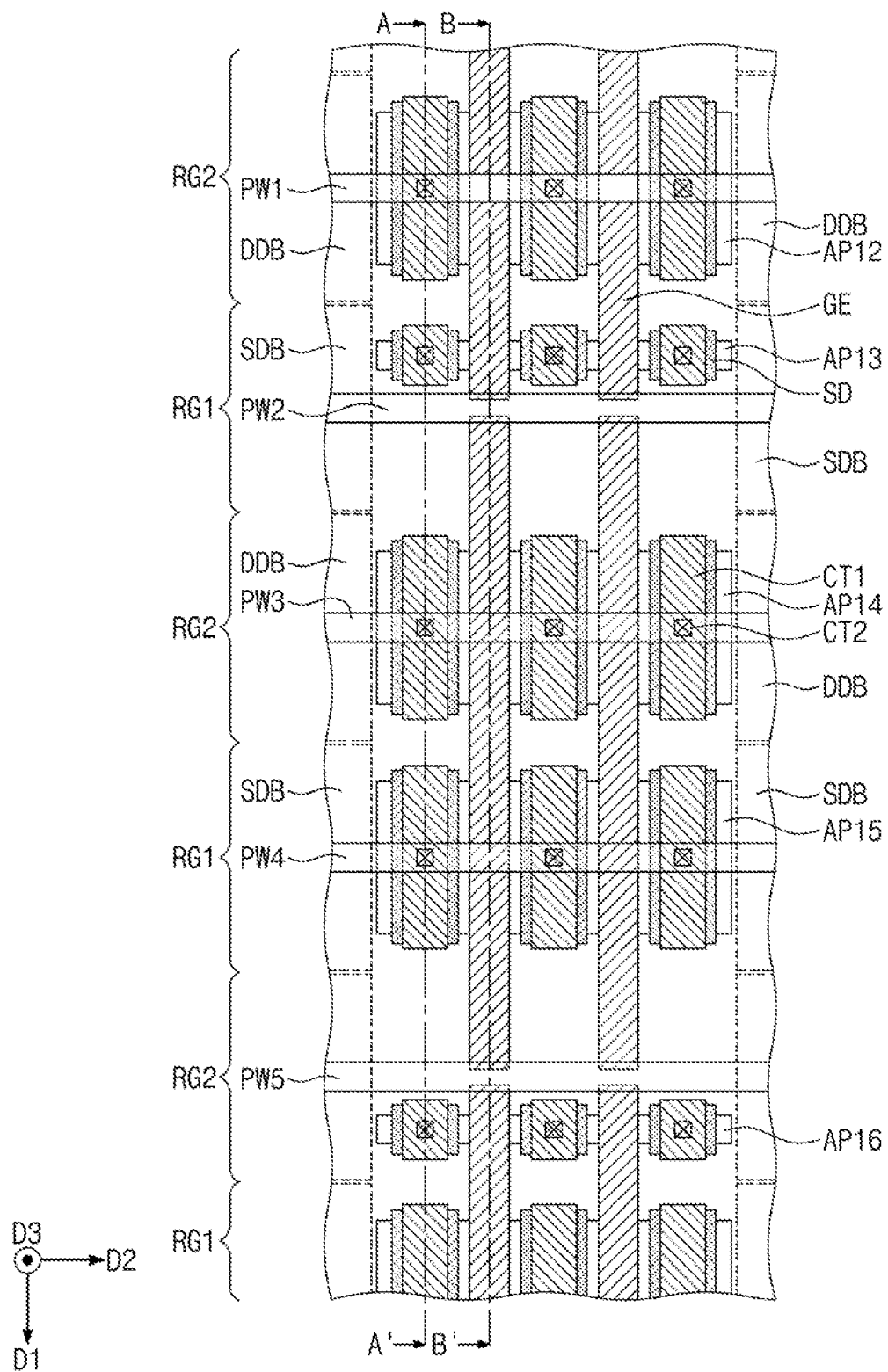
Figure 6B:
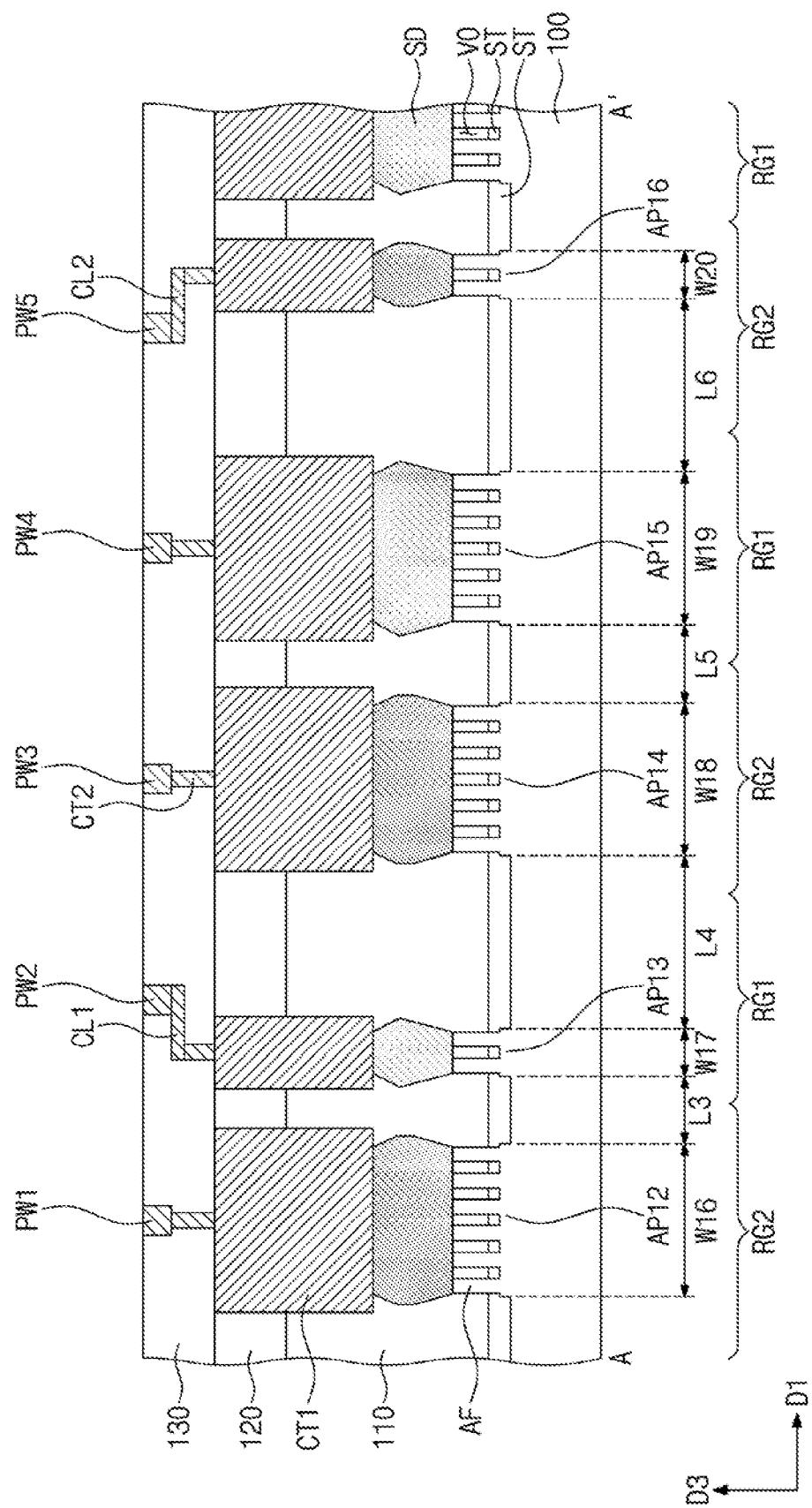
Figure 6C:
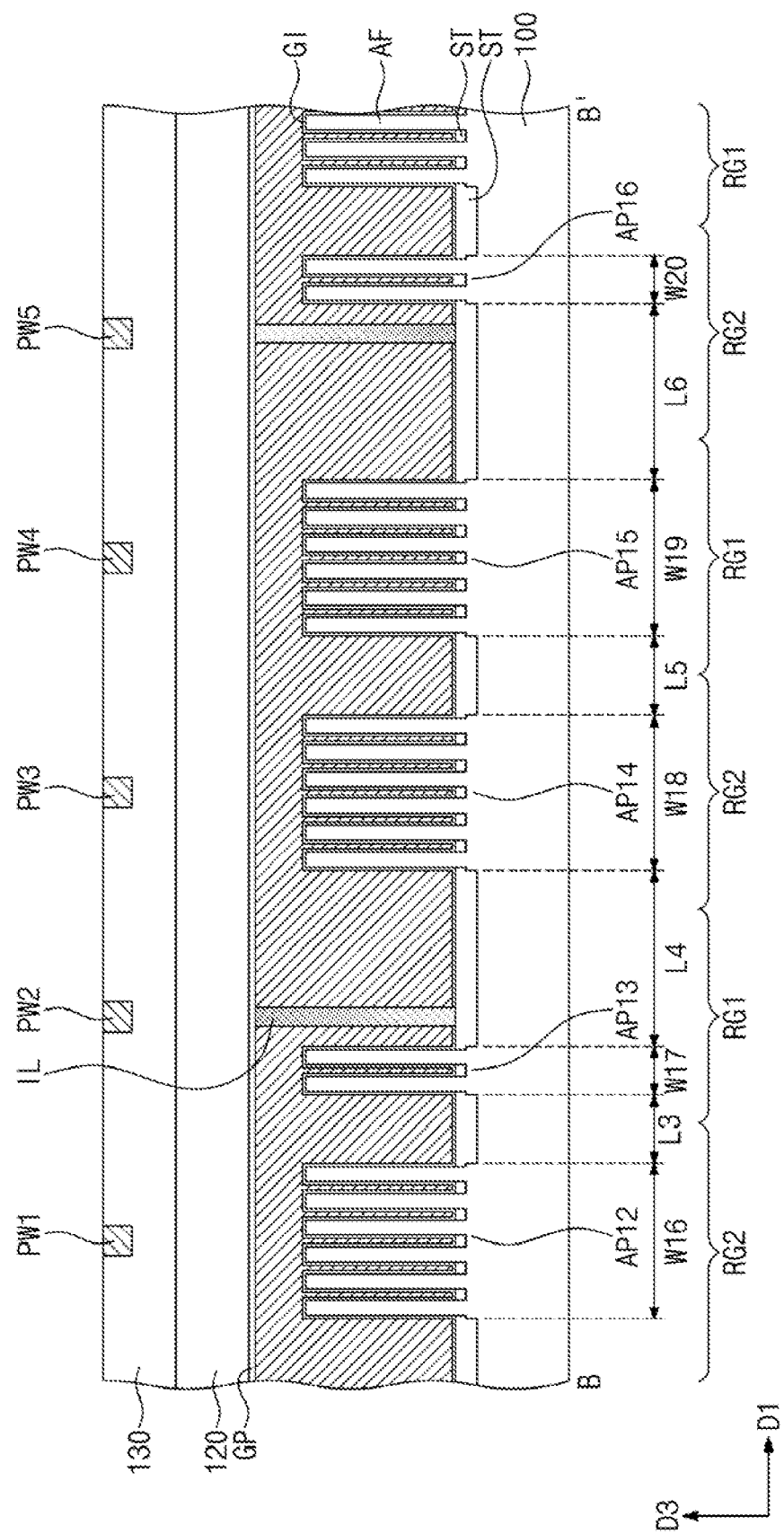

Referring to FIGS. 6A, 6B, and 6C, a semiconductor device according to the present embodiment may include twelfth, thirteenth, fourteenth, fifteenth, and sixteenth active patterns AP12, AP13, AP14, AP15, and AP16, which are defined in an upper portion of the substrate 100. The twelfth to sixteenth active patterns AP12, AP13, AP14, AP15, and AP16 may be sequentially arranged in or along the first direction D1.

A width of the twelfth active pattern AP12 in the first direction D1 may be defined as a sixteenth width W16, a width of the thirteenth active pattern AP13 in the first direction D1 may be defined as a seventeenth width W17, a width of the fourteenth active pattern AP14 in the first direction D1 may be defined as an eighteenth width W18, a width of the fifteenth active pattern AP15 in the first direction D1 may be defined as a nineteenth width W19, and a width of the sixteenth active pattern AP16 in the first direction D1 may be defined as a twentieth width W20.

The sixteenth width W16, the eighteenth width W18, and the nineteenth width W19 may be substantially equal to each other. The seventeenth width W17 and the twentieth width W20 may be substantially equal to each other. The sixteenth width W16, the eighteenth width W18, and the nineteenth width W19 may be at least two times the seventeenth width W17 or the twentieth width W20.

When measured in the first direction D1, the shortest distance between the twelfth active pattern AP12 and the thirteenth active pattern AP13 may be defined as a third distance L3. When measured in the first direction D1, the shortest distance between the thirteenth active pattern AP13 and the fourteenth active pattern AP14 may be defined as a fourth distance L4. When measured in the first direction D1, the shortest distance between the fourteenth active pattern AP14 and the fifteenth active pattern AP15 may be defined as a fifth distance L5. When measured in the first direction D1, the shortest distance between the fifteenth active pattern AP15 and the sixteenth active pattern AP16 may be defined as a sixth distance L6.

The third distance L3 and the fifth distance L5 may be substantially equal to each other. The fourth distance L4 and the sixth distance L6 may be substantially equal to each other. The fourth distance L4 and the sixth distance L6 may be at least two times the third distance L3 or the fifth distance L5.

The twelfth active pattern AP12 may be vertically overlapped with the first power rail PW1. The thirteenth active pattern AP13 may not be vertically overlapped with the second power rail PW2. The fourteenth active pattern AP14 may be vertically overlapped with the third power rail PW3. The fifteenth active pattern AP15 may be vertically overlapped with the fourth power rail PW4. The sixteenth active pattern AP16 may not be vertically overlapped with a fifth power rail PW5.

One fourteenth active pattern AP14 and one fifteenth active pattern AP15 may be between each adjacent pair of the insulating patterns IL (e.g., see FIG. 6C).

Each of the twelfth to sixteenth active patterns AP12, AP13, AP14, AP15, and AP16 may include a plurality of active fins AF. The active fins AF may be in an upper portion of each of the twelfth to sixteenth active patterns AP12, AP13, AP14, AP15, and AP16 and may be spaced apart from each other in the first direction D1. The device isolation layer ST may be between the active fins AF. A void VO may be between the active fins AF and between a source/drain pattern SD and the device isolation layer ST. In an implementation, the void VO may be filled with air.

The number of the active fins AF in the thirteenth active pattern AP13 may be equal to the number of the active fins AF in the sixteenth active pattern AP16. The number of the active fins AF in the twelfth active pattern AP12, the number of the active fins AF in the fourteenth active pattern AP14, and the number of the active fins AF in the fifteenth active pattern AP15 may be the same. The number of the active fins AF in the fourteenth active pattern AP14 may be at least two times the number of the active fins AF in the thirteenth active pattern AP13. In an implementation, the number of the active fins AF in the thirteenth active pattern AP13 may be two, and the number of the active fins AF in the fourteenth active pattern AP14 may be six.

Figure 7A:
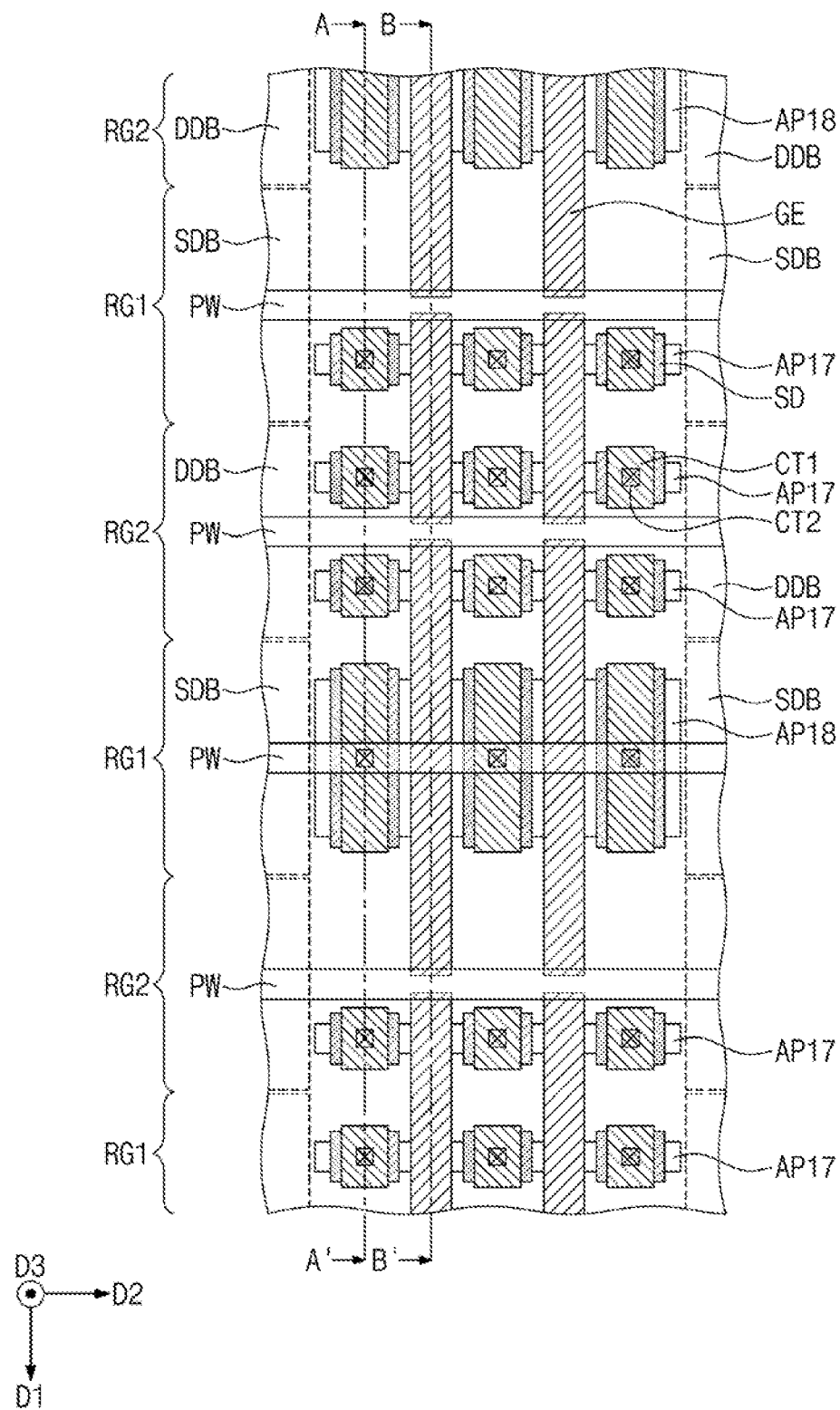
Figure 7B:
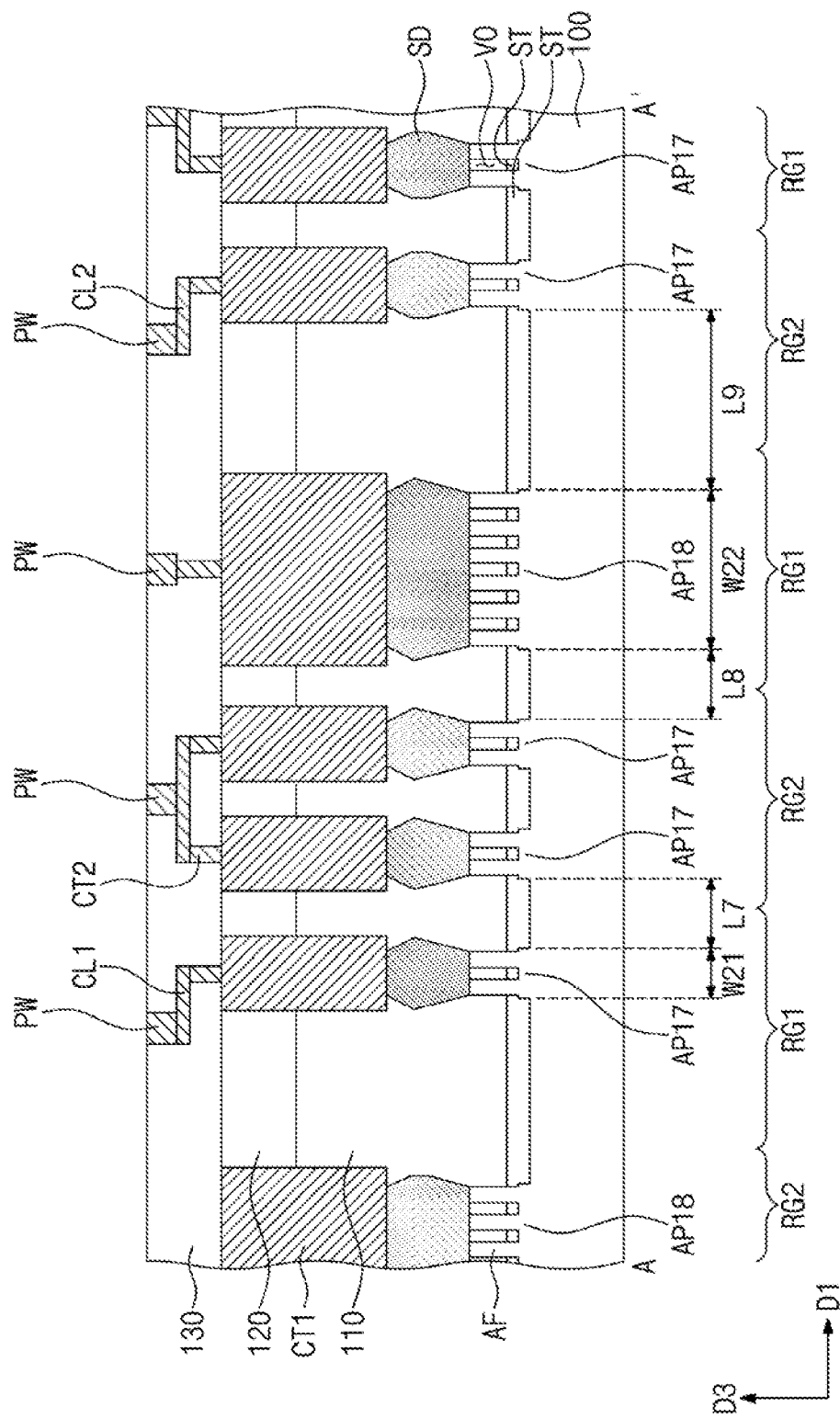
Figure 7C:
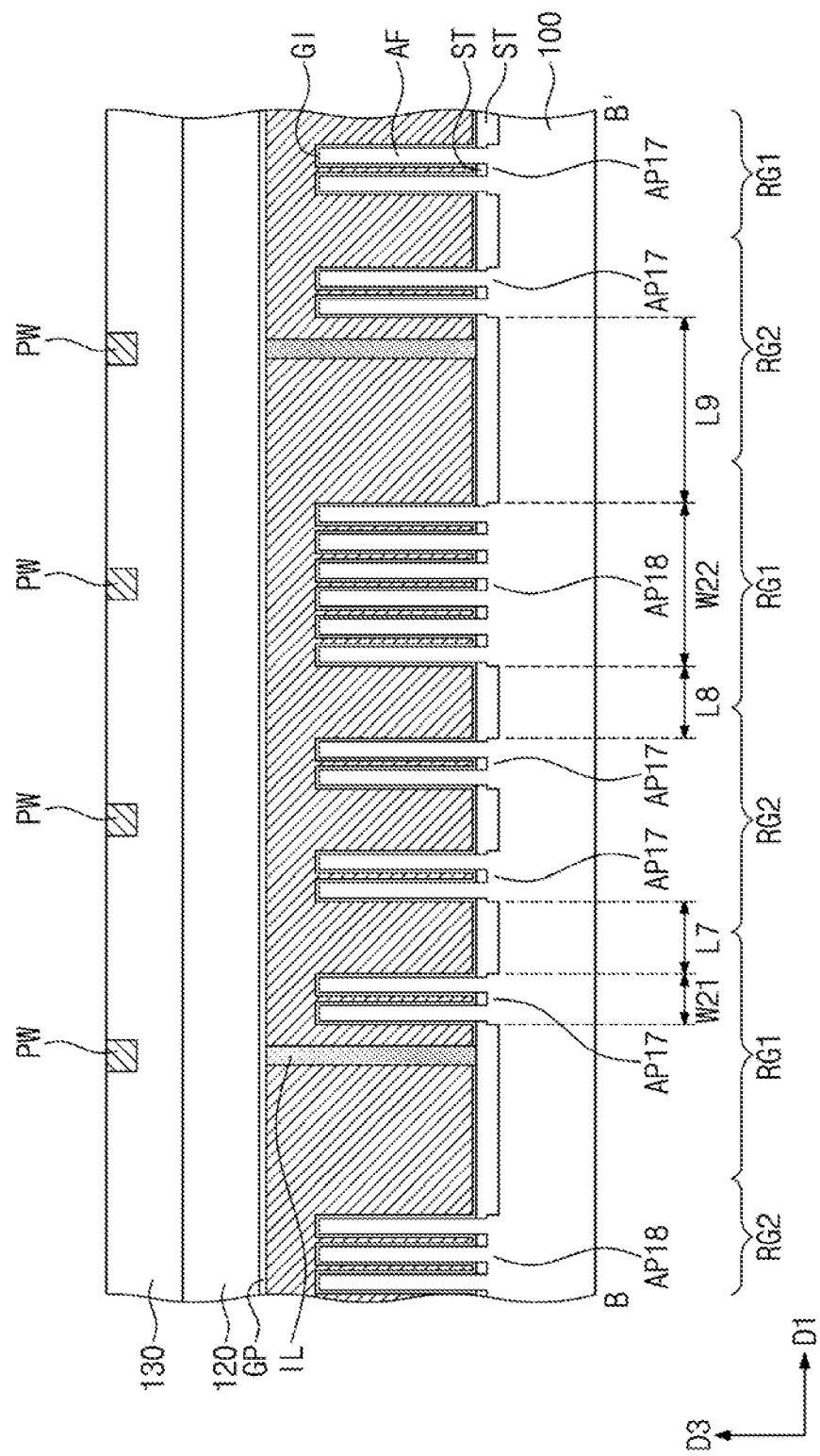

Referring to FIGS. 7A, 7B, and 7C, a semiconductor device according to the present embodiment may include seventeenth active patterns AP17 and eighteenth active patterns AP18, which are defined in an upper portion of the substrate 100. The seventeenth and eighteenth active patterns AP17 and AP18 may be arranged in the first direction D1.

A width of the seventeenth active pattern AP17 in the first direction D1 may be defined as a twenty-first width W21, and a width of the eighteenth active pattern AP18 in the first direction D1 may be defined as a twenty-second width W22. The twenty-second width W22 may be at least two times the twenty-first width W21.

When measured in the first direction D1, the shortest distance between adjacent ones of the seventeenth active patterns AP17 may be defined as a seventh distance L7. The shortest distance, in the first direction D1, between the eighteenth active pattern AP18 and the seventeenth active pattern AP17 adjacent to a first side of the eighteenth active pattern AP18 may be defined as an eighth distance L8. The shortest distance, in the first direction D1, between the eighteenth active pattern AP18 and the seventeenth active pattern AP17 adjacent to a second side of the eighteenth active pattern AP18 may be defined as a ninth distance L9. The first side and the second side may be opposite to each other.

The seventh distance L7 and the eighth distance L8 may be substantially equal to each other. The ninth distance L9 may be at least two times the seventh distance L7 or the eighth distance L8.

Each of the seventeenth active patterns AP17 may not be vertically overlapped with a corresponding one of power rails PW. Each of the eighteenth active patterns AP18 may be vertically overlapped with a corresponding one of the power rails PW.

Three seventeenth active patterns AP17 and one eighteenth active pattern AP18 may be between each adjacent pair of the insulating patterns IL (e.g., see FIG. 7C).

In an implementation, a structure, in which three active patterns with relatively small widths (i.e., the seventeenth active patterns AP17) and one active pattern with a relatively large width (i.e., the eighteenth active pattern AP18) are sequentially disposed, may be repeated in the semiconductor device.

Figure 8A:
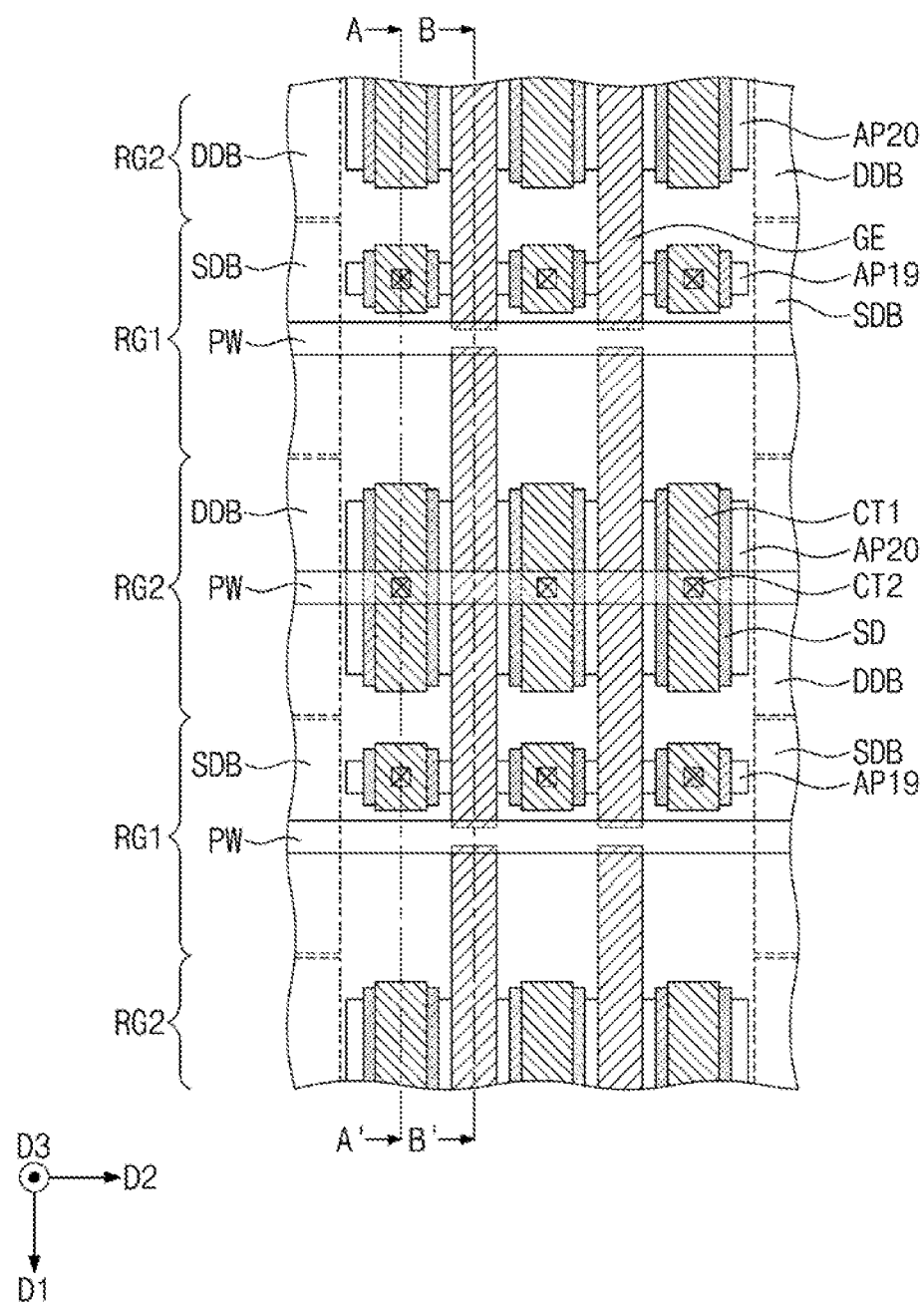
Figure 8B:
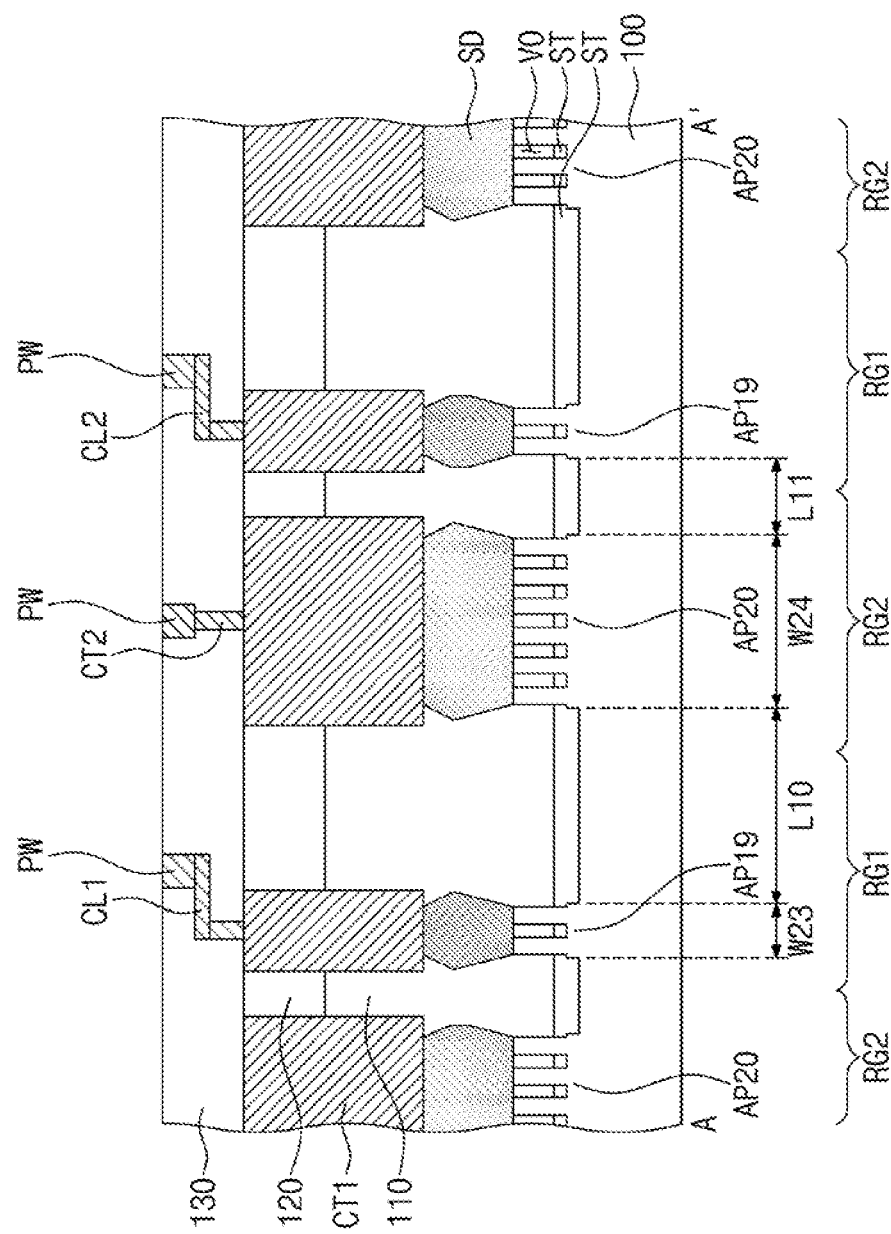
Figure 8C:
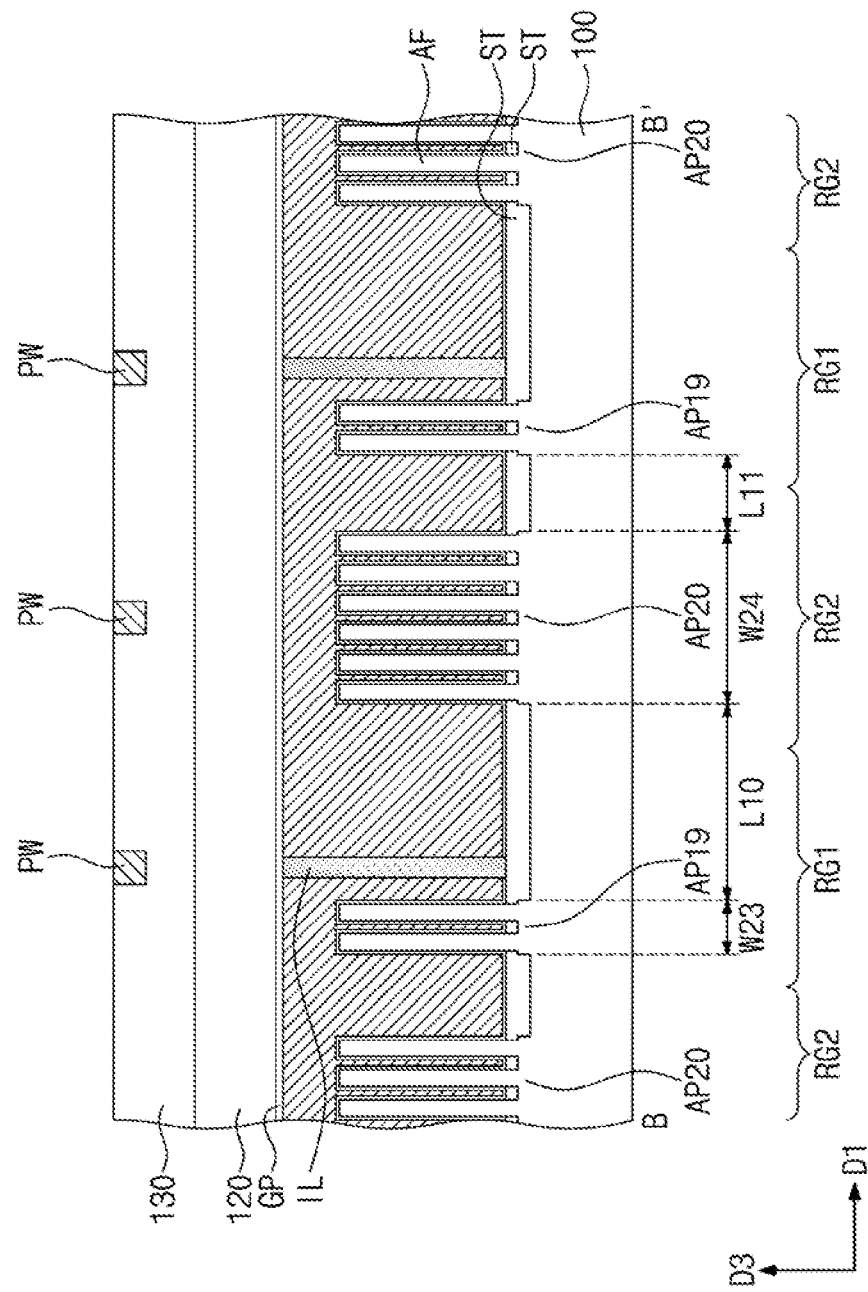

Referring to FIGS. 8A, 8B, and 8C, a semiconductor device according to the present embodiment may include nineteenth active patterns AP19 and twentieth active patterns AP20, which are defined in an upper portion of the substrate 100. The nineteenth and twentieth active patterns AP19 and AP20 may be alternately arranged in the first direction D1.

A width of the nineteenth active pattern AP19 in the first direction D1 may be defined as a twenty-third width W23, and a width of the twentieth active pattern AP20 in the first direction D1 may be defined as a twenty-fourth width W24. The twenty-fourth width W24 may be at least two times the twenty-third width W23.

The shortest distance, in the first direction D1, between the eighteenth active pattern AP18 and the nineteenth active pattern AP19 adjacent to a first side of the twentieth active pattern AP20 may be defined as a tenth distance L10. The shortest distance, in the first direction D1, between the twentieth active pattern AP20 and the nineteenth active pattern AP19 adjacent to a second side of the twentieth active pattern AP20 may be defined as an eleventh distance L11. The first side and the second side may be opposite to each other. The tenth distance L10 may be at least two times the eleventh distance L11.

Each of the nineteenth active patterns AP19 may not be vertically overlapped with a corresponding one of the power rails PW. Each of the twentieth active patterns AP20 may be vertically overlapped with a corresponding one of the power rails PW.

One nineteenth active pattern AP19 and one twentieth active pattern AP20 may be between each adjacent pair of the insulating patterns IL (e.g., see FIG. 8C).

In an implementation, a structure, in which an active pattern with a relatively small width (i.e., the nineteenth active pattern AP19) and an active pattern with a relatively large width (i.e., the twentieth active pattern AP20) are sequentially disposed, may be repeated in the semiconductor device.

In an implementation, the source/drain patterns SD on the nineteenth active patterns AP19 may be p-type impurity regions, and the source/drain patterns SD on the twentieth active patterns AP20 may be n-type impurity regions. For example, a width of an active pattern below the n-type impurity region may be at least two times a width of an active pattern below the p-type impurity region.

In an implementation, the source/drain patterns SD on the nineteenth active patterns AP19 may be n-type impurity regions, and the source/drain patterns SD on the twentieth active patterns AP20 may be p-type impurity regions.

Figure 9:
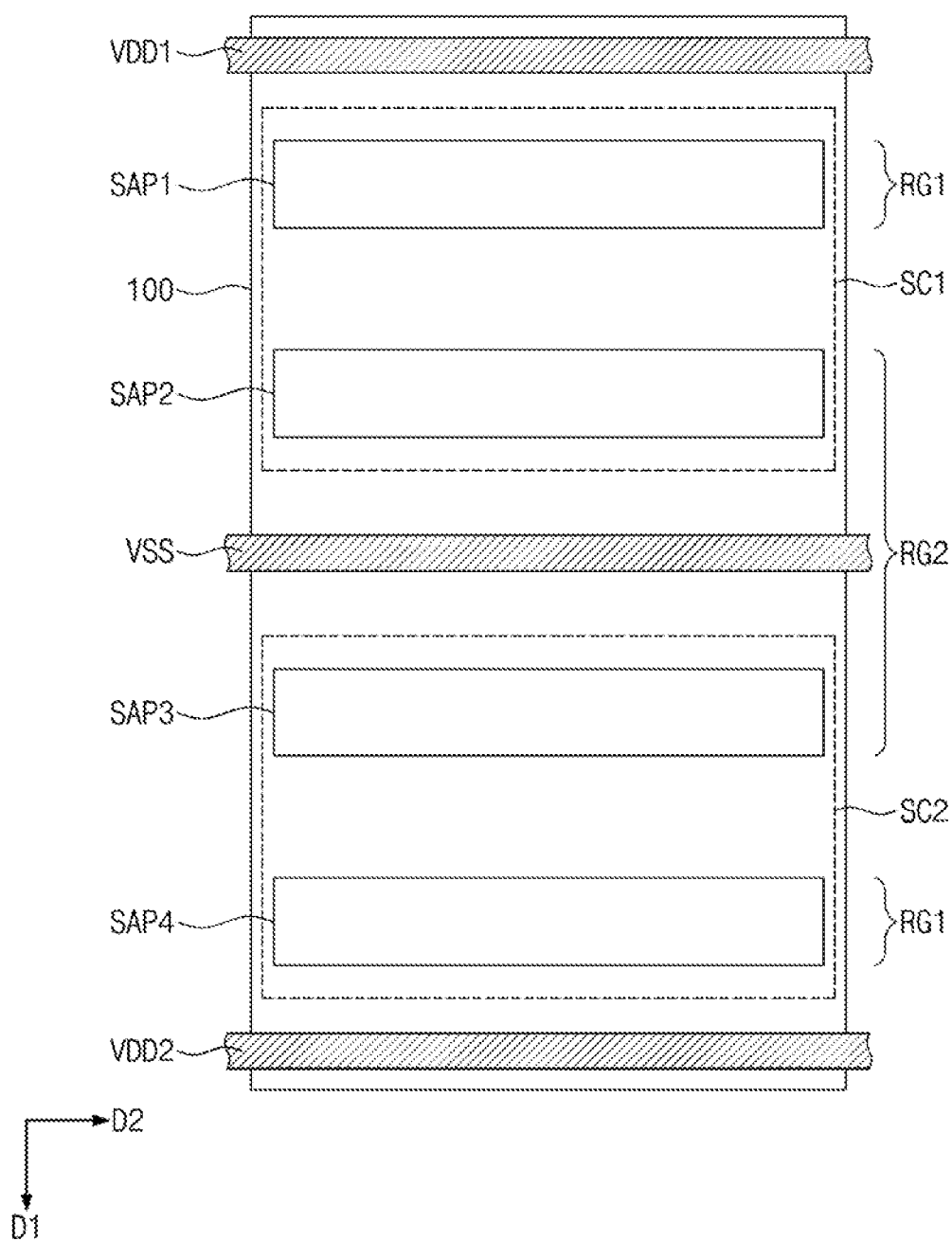
FIGS. 9 to 12 illustrate semiconductor devices according to some embodiments.

FIGS. 9 to 12 illustrate semiconductor devices according to some embodiments. Referring to FIG. 9, a semiconductor device according to the present embodiment may include power rails, which are sequentially arranged in the first direction D1. For example, the semiconductor device may include a first VDD rail VDD1, a VSS rail VSS, and a second VDD rail VDD2. The VDD rail may be an interconnection line, to which a drain voltage (Vdd) (e.g., a power voltage) is provided, and the VSS rail may be an interconnection line, to which a source voltage (Vss) (e.g., a ground voltage) is provided.

In an implementation, the semiconductor device may include first to fourth single active patterns SAP1-SAP4, which are sequentially arranged in the first direction D1. The first to fourth single active patterns SAP1-SAP4 may be active patterns, which are locally placed between rails but are not in a region below the rails. In an implementation, the first to fourth single active patterns SAP1-SAP4 may correspond to the first and fourth active patterns AP1 and AP4 of FIGS. 1A to 1D.

A first single height cell SC1 may be between the first VDD rail VDD1 and the VSS rail VSS. A second single height cell SC2 may be between the second VDD rail VDD2 and the VSS rail VSS. The first single height cell SC1 may include the first and second single active patterns SAP1 and SAP2 and gate electrodes and source/drain patterns, which are on the first and second single active patterns SAP1 and SAP2. The second single height cell SC2 may include the third and fourth single active patterns SAP3 and SAP4 and gate electrodes and source/drain patterns, which are on the third and fourth single active patterns SAP3 and SAP4. One PMOSFET region and one NMOSFET region may be between a pair of power rails, which are adjacent to each other. In an implementation, one of the PMOSFET and NMOSFET regions may be between the adjacent pair of the power rails, like a filler cell to be described below.

Adjacent regions, between which one power rail is disposed, may have the same conductivity type. For example, a PMOSFET region, an NMOSFET region, an NMOSFET region, a PMOSFET region, a PMOSFET region, and an NMOSFET region may be sequentially disposed in the first direction D1. Each of the first and second single height cells SC1 and SC2 may include one first region RG1 and one second region RG2. The first region RG1 may be a PMOSFET region, and the second region RG2 may be an NMOSFET region. As an example, the first and fourth single active pattern SAP1 and SAP4 may be active patterns on the PMOSFET regions, and the second and third single active patterns SAP2 and SAP3 may be active patterns on the NMOSFET regions. The second region RG2 of the first single height cell SC1 may be adjacent to the second region RG2 of the second single height cell SC2.

Each of the first and second single height cells SC1 and SC2 may constitute one logic cell. In the present specification, the logic cell may mean a logical device (e.g., an inverter, a flip-flop, and so forth), which is configured to execute a specific function. In an implementation, the logic cell may include transistors, which constitute the logical device and include at least one active region, source/drain regions, and gate electrodes, and interconnection lines, which connects the transistors to each other.

Figure 10:
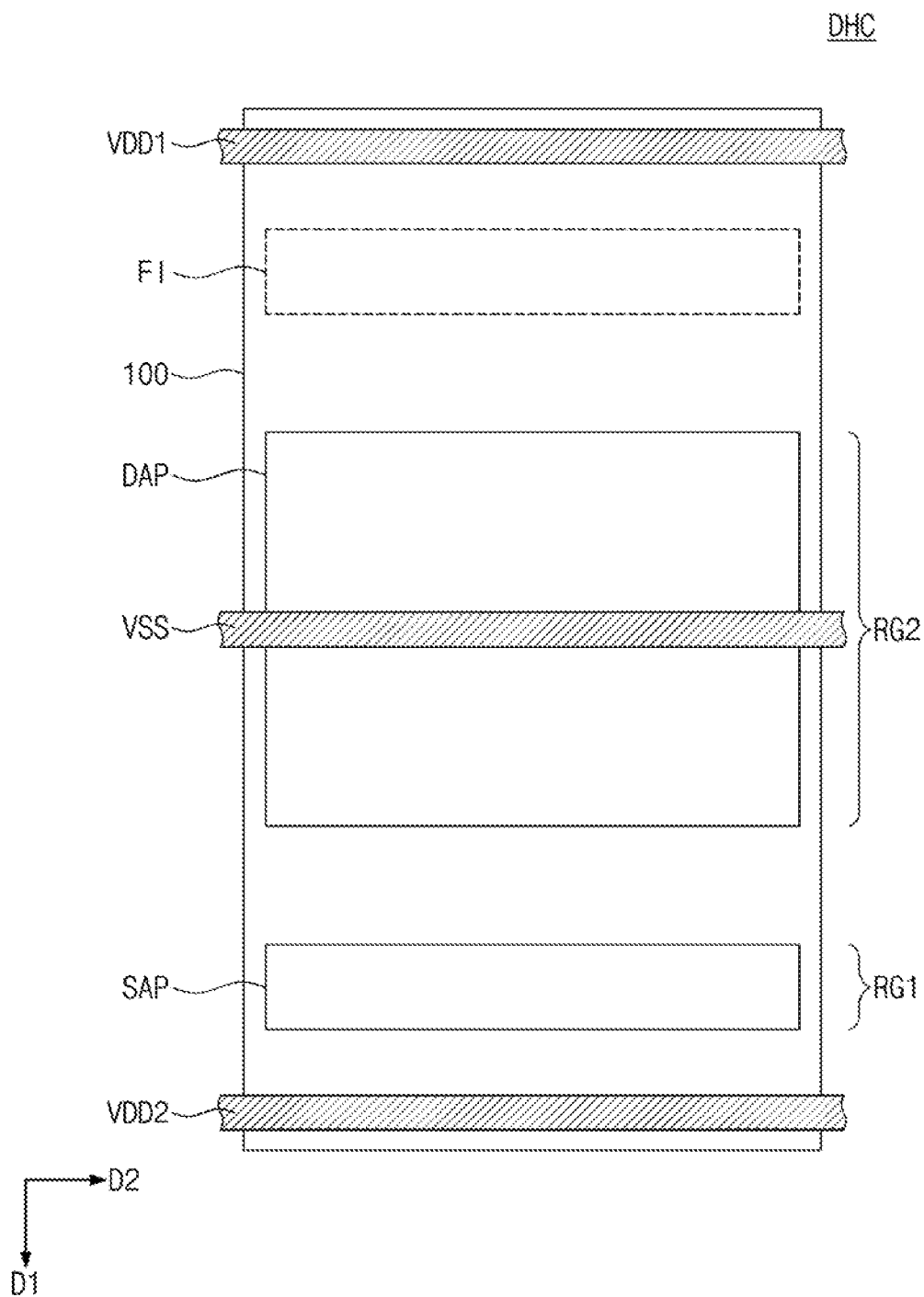

Referring to FIG. 10, a semiconductor device according to the present embodiment may include power rails, which are sequentially arranged in the first direction D1. For example, the semiconductor device may include the first VDD rail VDD1, the VSS rail VSS, and the second VDD rail VDD2.

The semiconductor device according to the present embodiment may include a double height cell DHC on the substrate 100. The double height cell DHC may refer to a structure (e.g., including an active pattern, a source/drain, or a gate electrode), which is in a region between the first and second VDD rails VDD1 and VDD2. The VSS rail VSS may cross the double height cell DHC. The double height cell DHC may constitute one logic cell. The double height cell DHC may have a width that is two to three times the width of each of the single height cells SC1 and SC2 of FIG. 9, when measured in the first direction D1. The width of the logic cell may be defined as a distance between the power rails.

The double height cell DHC may include a single active pattern SAP, a double active pattern DAP, gate electrodes thereon, and source/drain patterns. The single active pattern SAP may be adjacent to the second VDD rail VDD2. In an implementation, the single active pattern SAP may be an active pattern on the first region RG1 (e.g., PMOSFET region). In an implementation, the single active pattern SAP may be an active pattern on the NMOSFET region.

In an implementation, the double height cell DHC may include a filler cell FI. The filler cell FI may be near the first VDD rail VDD1. In an implementation, the filler cell FI may not be disposed, and the single active pattern SAP may be in the region for the filler cell FI. The double active pattern DAP may be vertically overlapped with the VSS rail VSS. The double active pattern DAP may be between the single active pattern SAP and the filler cell FI.

The double active pattern DAP may be similar to a structure, in which the second and third single active patterns SAP2 and SAP3 adjacent to the VSS rail VSS in the semiconductor device of FIG. 9 are merged. The double active pattern DAP may be an active pattern, which is overlapped with the rails and is extended to a region below the rails. In an implementation, the double active pattern DAP may correspond to the second and third active patterns AP2 and AP3 of FIGS. 1A to 1D. In an implementation, the double active pattern DAP may be an active pattern, which is on the second region RG2 (e.g., the NMOSFET region)

having a different conductivity type from the first region RG1. In an implementation, the double active pattern DAP may be an active pattern on the PMOSFET region.

The filler cell FI may be a region, in which the active pattern is not formed. For example, the filler cell FI may be gate structures and/or source/drain patterns, which are formed on the device isolation layer. The filler cell FI may be a dummy structure, which is formed to reduce a process variation and is not electrically connected to logic cells or rails adjacent thereto. In an implementation, in the semiconductor device according to an embodiment, any active pattern may not be formed in a region, in which the first single active pattern SAP1 of the semiconductor device of FIG. 9 is provided, and the filler cell FI may be provided in the region.

Figure 11:
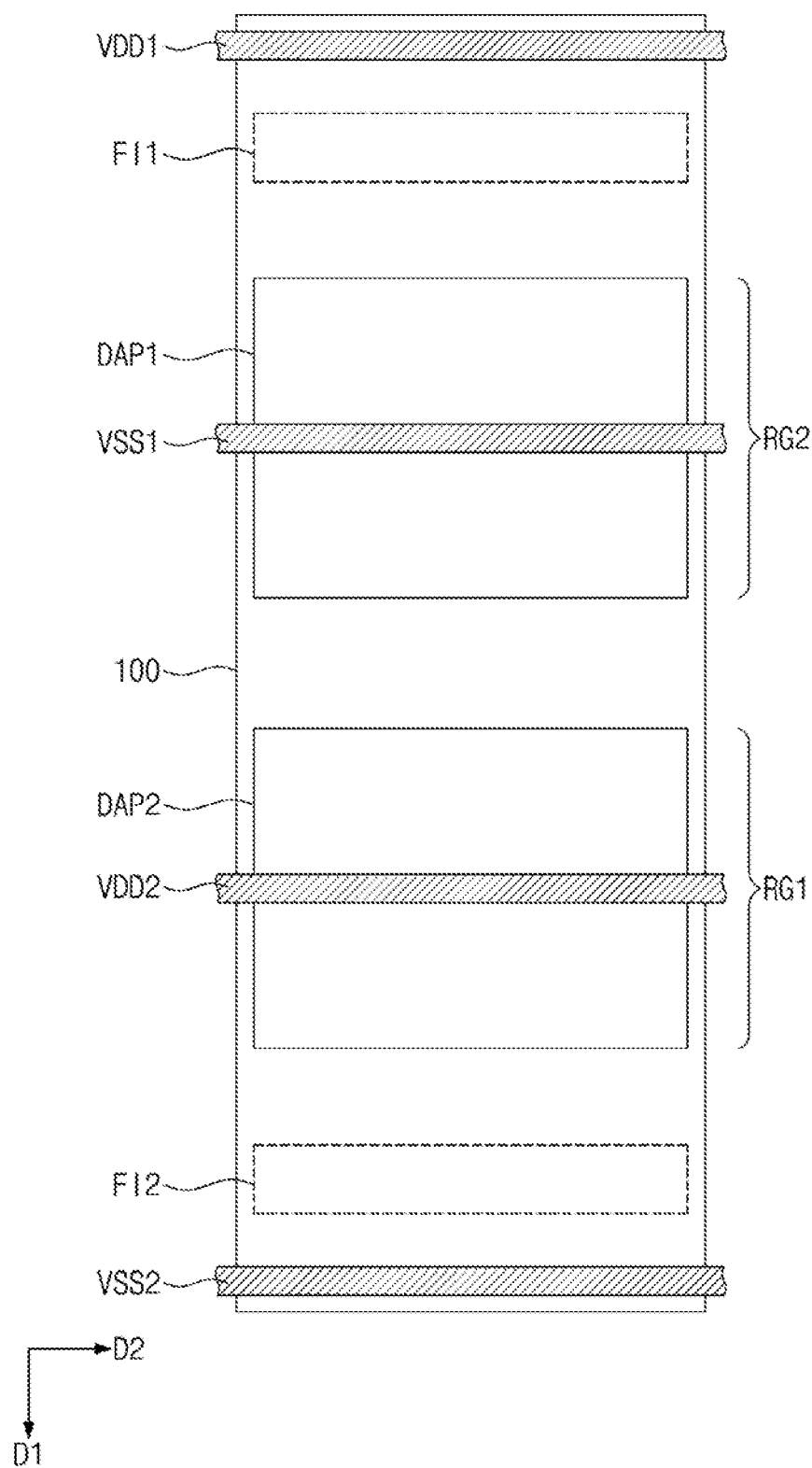

Referring to FIG. 11, a semiconductor device according to the present embodiment may include power rails, which are sequentially arranged in the first direction D1. For example, the semiconductor device may include a first VDD rail VDD1, a first VSS rail VSS1, a second VDD rail VDD2, and a second VSS rail VSS2.

The semiconductor device according to the present embodiment may include a triple height cell THC on the substrate 100. The triple height cell THC may be between the first VDD rail VDD1 and the second VSS rail VSS2. The first VSS rail VSS1 and the second VDD rail VDD2 may cross the triple height cell THC. The triple height cell THC may constitute one logic cell. The triple height cell THC may have a width that is three to four times the width of the single height cells SC1 and SC2 of FIG. 9, when measured in the first direction D1. The triple height cell THC may include a first filler cell FI1, a second filler cell FI2, a first double active pattern DAP1, and a second double active pattern DAP2. The first filler cell FI1 may be adjacent to the first VDD rail VDD1. The second filler cell FI2 may be adjacent to the second VSS rail VSS2. In an implementation, at least one of the filler cells FI1 and FI2 may not be provided, and the single active pattern SAP may be in a region for the filler cells FI1 and FI2.

The first double active pattern DAP1 may be vertically overlapped with the first VSS rail VSS1. The second double active pattern DAP2 may be vertically overlapped with the second VDD rail VDD2. The first and second double active patterns DAP1 and DAP2 may correspond to the second and third active patterns AP2 and AP3 of FIGS. 1A to 1D. The first double active pattern DAP1 and the second double active pattern DAP2 may be active patterns, which are on regions of different conductivity types. In an implementation, the first double active pattern DAP1 may be an active pattern on the second region RG2 (e.g., the NMOSFET region), and the second double active pattern DAP2 may be an active pattern on the first region RG1 (e.g., the PMOSFET region).

Figure 12:
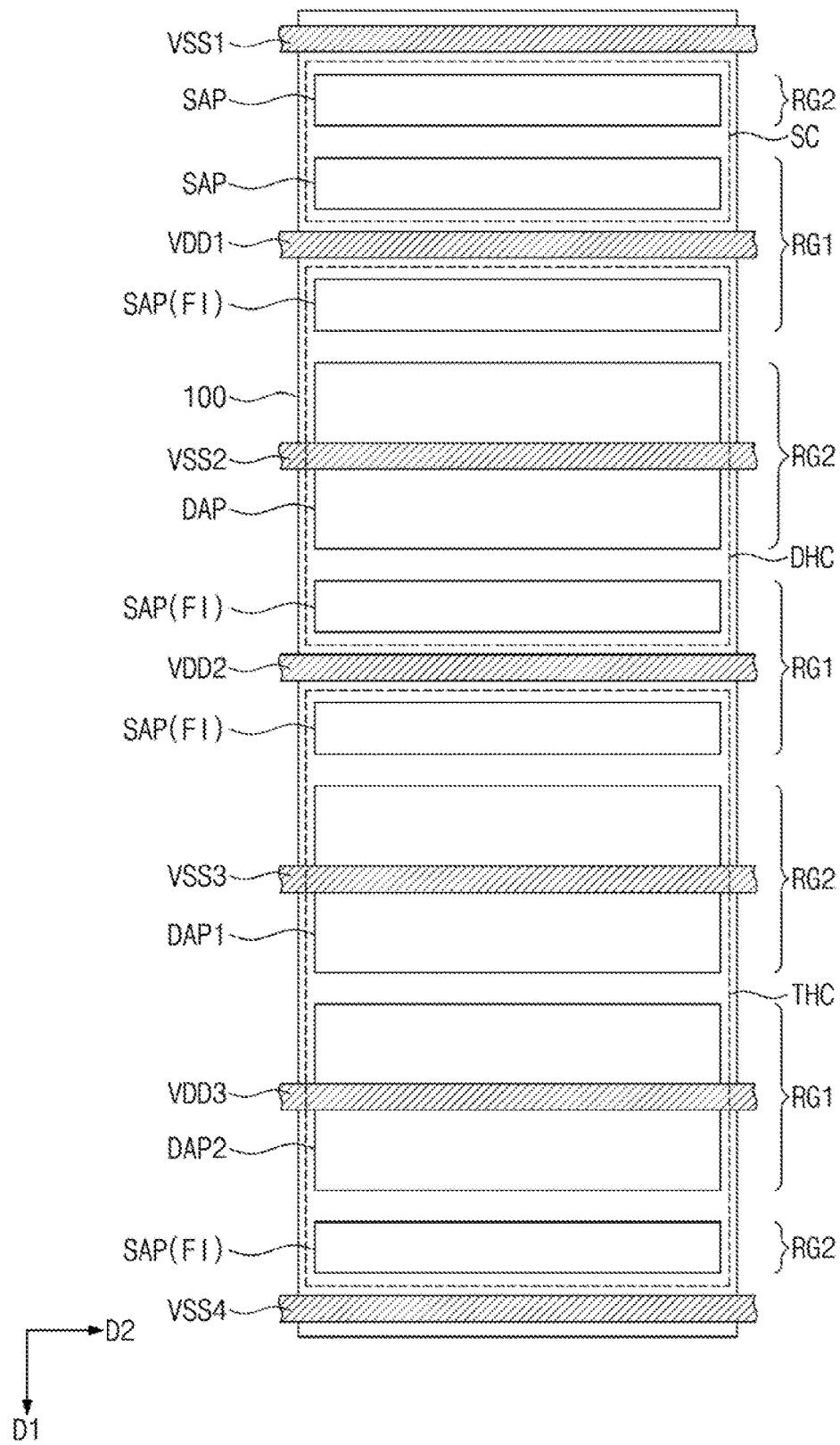

Referring to FIG. 12, a semiconductor device according to the present embodiment may include first to seventh power rails, which are sequentially arranged in the first direction D1. For example, the semiconductor device may include a first VSS rail VSS1, a first VDD rail VDD1, a second VSS rail VSS2, a second VDD rail VDD2, a third VSS rail VSS3, a third VDD rail VDD3, and a fourth VSS rail VSS4.

The semiconductor device according to the present embodiment may include a first logic cell and a second logic cell, which are on the substrate 100 and are sequentially arranged in the first direction D1. Each of the first logic cell and the second logic cell may include a PMOSFET region and an NMOSFET region. The first logic cell may be a single height cell SC, which is between the first VSS rail VSS1 and the first VDD rail VDD1 and includes a pair of single active patterns SAP. The single active pattern SAP adjacent to the first VSS rail VSS1 may be on the second region RG2 (e.g., the NMOSFET region), and the single active pattern SAP adjacent to the first VDD rail VDD1 may be on the first region RG1 (e.g., the PMOSFET region).

The second logic cell may be the double height cell DHC including the double active pattern DAP, which is between the first VDD rail VDD1 and the second VDD rail VDD2. The double active pattern DAP may be between the first VDD rail VDD1 and the second VSS rail VSS2 and may extend to a region below the second VSS rail VSS2. For example, the double active pattern DAP may be vertically overlapped with the second VSS rail VSS2. A width of the double active pattern DAP in the first direction D1 may be two to three times a width of one single active pattern SAP in the first direction D1. The double active pattern DAP may be on the second region RG2 (e.g., the NMOSFET region).

The double height cell DHC may include the single active patterns SAP, which are adjacent to the first VDD rail VDD1 and the second VDD rail VDD2. The single active patterns SAP may be on the first region RG1 (e.g., the PMOSFET region). At least one of the single active patterns SAP may be replaced with the filler cell FI.

A third logic cell may be on the substrate 100. The third logic cell may be spaced apart from the second logic cell in the first direction D1. The third logic cell may be the triple height cell THC including the first and second double active patterns DAP1 and DAP2, which are between the second VDD rail VDD2 and the fourth VSS rail VSS4. The first double active pattern DAP1 may be below the third VSS rail VSS3, and the second double active pattern DAP2 may be below the third VDD rail VDD3. The first double active pattern DAP1 may be on the second region RG2 (e.g., the NMOSFET region), and the second double active pattern DAP2 may be on the first region RG1 (e.g., the PMOSFET region). Widths of the double active patterns DAP1 and DAP2 in the first direction D1 may be two to three times the width of one single active pattern SAP in the first direction D1.

The triple height cell THC may include the single active patterns SAP, which are adjacent to the second VDD rail VDD2 and the fourth VSS rail VSS4. The single active pattern SAP adjacent to the second VDD rail VDD2 may be on the first region RG1 (e.g., the PMOSFET region). The single active pattern SAP adjacent to the fourth VSS rail VSS4 may be on the second region RG2 (e.g., the NMOSFET region). At least one of the single active patterns SAP may be replaced with the filler cell FI.

By way of summation and review, as the electronic industry advances, there is an increasing demand for semiconductor devices with improved characteristics. For example, semiconductor devices may have high reliability, high performance, and/or multiple functions. Complexity and/or integration density of semiconductor devices may be increased.

One or more embodiments may provide a semiconductor device including a gate-all-around type transistor.

One or more embodiments may provide a semiconductor device, in which gate-all-around type transistors with improved electric characteristics are provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   at least one first active pattern, at least one second active pattern, and at least one third active pattern on an upper portion of the substrate, the at least one first active pattern, the at least one second active pattern, and the at least one third active pattern being sequentially arranged in a first direction and extending in a second direction crossing the first direction;
   a first power rail connected to the at least one first active pattern;
   a second power rail connected to the at least one second active pattern; and
   a third power rail connected to the at least one third active pattern,
   wherein:
   a width of the at least one second active pattern in the first direction is at least two times a width of the at least one first active pattern in the first direction and is at least two times a width of the at least one third active pattern in the first direction,
   the at least one first active pattern is not vertically overlapped with the first power rail,
   the at least one second active pattern is vertically overlapped with the second power rail, and
   the at least one third active pattern is not vertically overlapped with the third power rail.

2. The semiconductor device as claimed in claim 1, wherein the at least one second active pattern includes a plurality of second active patterns.

3. The semiconductor device as claimed in claim 1, further comprising channel patterns, which are provided on the at least one first active pattern, the at least one second active pattern, and the at least one third active pattern, respectively,
   wherein:
   each of the channel patterns includes a first semiconductor pattern and a second semiconductor pattern, which are stacked in a third direction crossing the first direction and the second direction, and
   when measured in the first direction, a width of the channel pattern on the at least one second active pattern is at least two times a width of the channel pattern on the at least one first active pattern and is at least two times a width of the channel pattern on the at least one third active pattern.

4. The semiconductor device as claimed in claim 1, further comprising:
   a fourth active pattern between the at least one second active pattern and the at least one third active pattern;
   a first source/drain pattern on the at least one second active pattern; and
   a second source/drain pattern on the fourth active pattern,
   wherein:
   the width of the at least one second active pattern in the first direction is substantially equal to a width of the fourth active pattern in the first direction, and
   the first source/drain pattern and the second source/drain pattern have different conductivity types from each other.

5. The semiconductor device as claimed in claim 4, further comprising a third source/drain pattern on the at least one first active pattern,
   wherein:
   a width of the first source/drain pattern in the first direction is at least two times a width of the third source/drain pattern in the first direction, and
   a width of the second source/drain pattern in the first direction is at least two times the width of the third source/drain pattern in the first direction.

6. The semiconductor device as claimed in claim 4, wherein a shortest distance between the at least one third active pattern and the fourth active pattern in the first direction is at least two times a shortest distance between the at least one first active pattern and the at least one second active pattern in the first direction.

7. The semiconductor device as claimed in claim 1, wherein the at least one first active pattern includes a pair of first active patterns, the pair of first active patterns being connected to the first power rail.

8. The semiconductor device as claimed in claim 7, further comprising:
   gate electrodes extending in the first direction; and
   an insulating pattern separating the gate electrodes from each other in the first direction,
   wherein the insulating pattern is between the pair of first active patterns.

9. The semiconductor device as claimed in claim 7, wherein the at least one third active pattern includes a pair of third active patterns, the pair of third active patterns being connected to the third power rail.

10. The semiconductor device as claimed in claim 1, further comprising:
    a first source/drain pattern on the at least one first active pattern; and
    a second source/drain pattern on the at least one third active pattern,
    wherein the first source/drain pattern and the second source/drain pattern have different conductivity types from each other.

11. The semiconductor device as claimed in claim 1, wherein each of the at least one first active pattern, the at least one second active pattern, and the at least one third active pattern includes active fins in an upper portion thereof.

12. A semiconductor device, comprising:
    a substrate;
    a first active pattern, a second active pattern, a third active pattern, and a fourth active pattern on an upper portion of the substrate and sequentially arranged in a first direction;
    a first source/drain pattern, a second source/drain pattern, a third source/drain pattern, and a fourth source/drain pattern on the first active pattern, the second active pattern, the third active pattern, and the fourth active pattern, respectively;
    a gate electrode crossing the first active pattern, the second active pattern, the third active pattern, and the fourth active pattern and extending in the first direction; and
    a first power rail, a second power rail, a third power rail, and a fourth power rail connected to the first source/drain pattern, the second source/drain pattern, the third source/drain pattern, and the fourth source/drain pattern, respectively, the first power rail, the second power rail, the third power rail, and the fourth power rail extending in a second direction crossing the first direction, wherein:

a width of the second active pattern in the first direction is at least two times a width of the first active pattern in the first direction, a width of the third active pattern in the first direction is at least two times the width of the first active pattern in the first direction, the width of the second active pattern in the first direction is at least two times a width of the fourth active pattern in the first direction, the width of the third active pattern in the first direction is at least two times the width of the fourth active pattern in the first direction, the first active pattern is not vertically overlapped with the first power rail, the second active pattern is vertically overlapped with the second power rail, the third active pattern is vertically overlapped with the third power rail, and the fourth active pattern is not vertically overlapped with the fourth power rail.

13. The semiconductor device as claimed in claim 12, wherein the width of the first active pattern in the first direction is substantially equal to the width of the fourth active pattern in the first direction.

14. The semiconductor device as claimed in claim 12, wherein:

a shortest distance between the first active pattern and the second active pattern in the first direction is at least two times a shortest distance between the second active pattern and the third active pattern in the first direction, and a shortest distance between the third active pattern and the fourth active pattern in the first direction is at least two times the shortest distance between the second active pattern and the third active pattern in the first direction.

15. The semiconductor device as claimed in claim 12, wherein a shortest distance between the first active pattern and the second active pattern in the first direction is substantially equal to a shortest distance between the third active pattern and the fourth active pattern in the first direction.

* * * * *